United States Patent
Suzuki et al.

(10) Patent No.: US 7,151,567 B2
(45) Date of Patent: Dec. 19, 2006

(54) ELECTRONIC CAMERA WITH BACKLIGHT CORRECTION CAPABILITY

(75) Inventors: Nobuo Suzuki, Miyagi (JP); Kazuyuki Masukane, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 914 days.

(21) Appl. No.: 09/837,517

(22) Filed: Apr. 19, 2001

(65) Prior Publication Data
US 2001/0033333 A1    Oct. 25, 2001

(30) Foreign Application Priority Data
Apr. 21, 2000  (JP) ............... 2000-120507

(51) Int. Cl.
*H04N 3/14* (2006.01)
(52) U.S. Cl. ............... 348/296; 348/220.1; 348/302; 348/308
(58) Field of Classification Search ............... 348/308, 348/220.1, 302, 221.1, 370, 371
See application file for complete search history.

(56) References Cited

U.S. PATENT DOCUMENTS

| 6,542,194 | B1* | 4/2003 | Juen | 348/367 |
| 6,661,451 | B1* | 12/2003 | Kijima et al. | 348/220.1 |
| 6,710,808 | B1* | 3/2004 | Yamagishi | 348/362 |
| 6,956,605 | B1* | 10/2005 | Hashimoto | 348/301 |
| 2002/0085106 | A1* | 7/2002 | Beiley et al. | 348/296 |
| 2003/0090575 | A1* | 5/2003 | Miyamoto | 348/207.99 |

FOREIGN PATENT DOCUMENTS

| EP | 1 003 330 A1 | 5/2000 |
| JP | 2000-217037 | 8/2000 |

* cited by examiner

Primary Examiner—Ngoc-Yen Vu
Assistant Examiner—Anthony Daniels
(74) Attorney, Agent, or Firm—Arent Fox PLLC

(57) ABSTRACT

When a still image is picked up with an electronic camera utilizing a MOS type solid-state image pickup device, a flashing device is operated under the condition that both an image signal read operation and an electronic shutter operation are not performed, and the MOS type solid-state image pickup device is controlled so that the same exposure time is set to each photoelectric conversion element. Backlight correction can be achieved.

22 Claims, 13 Drawing Sheets

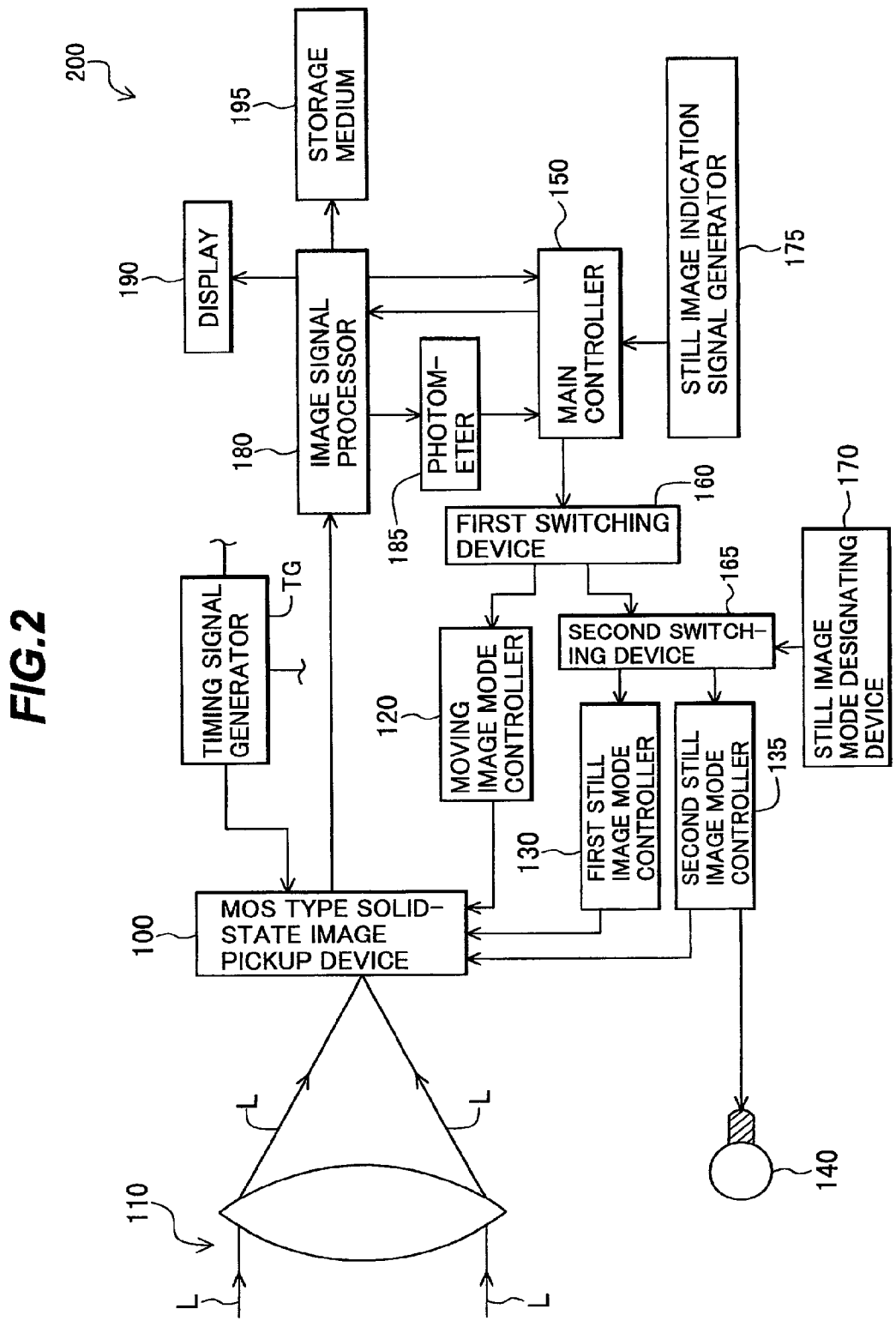

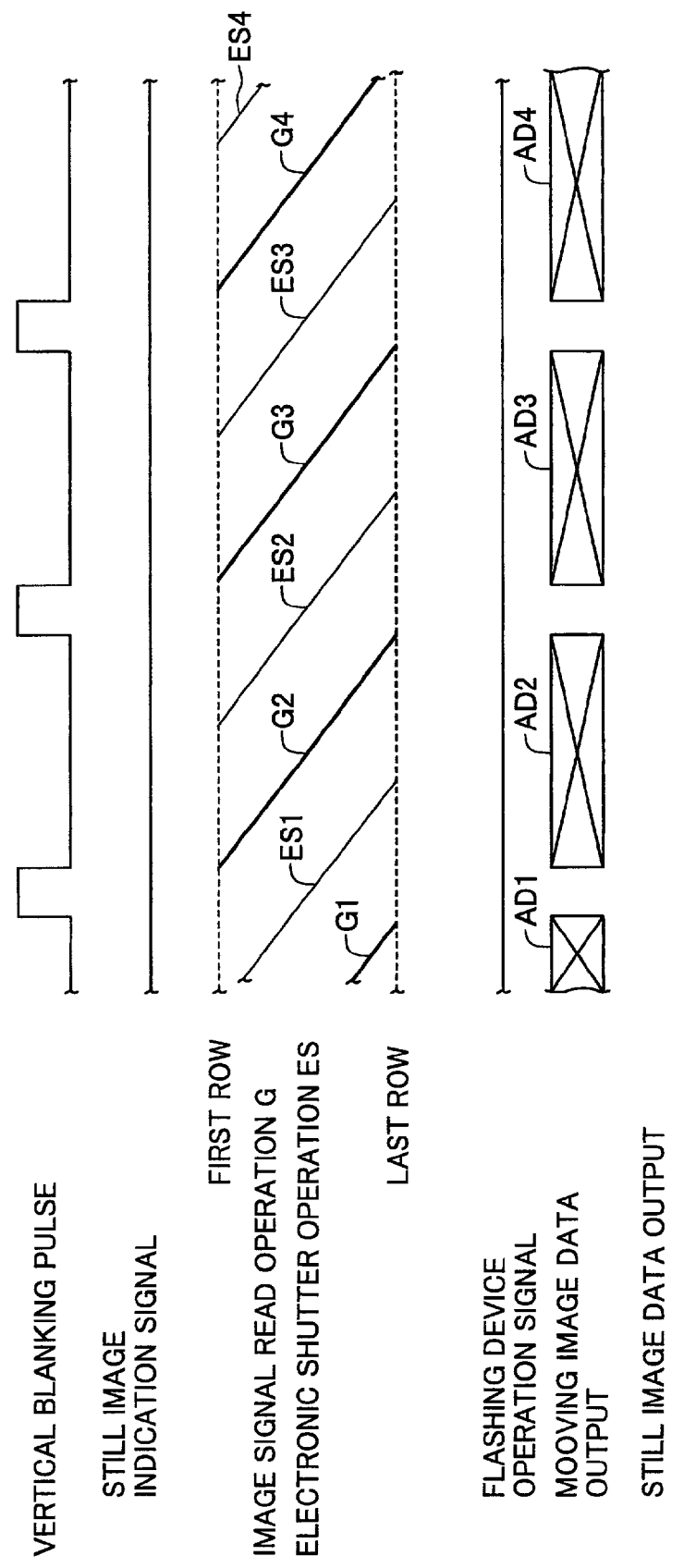

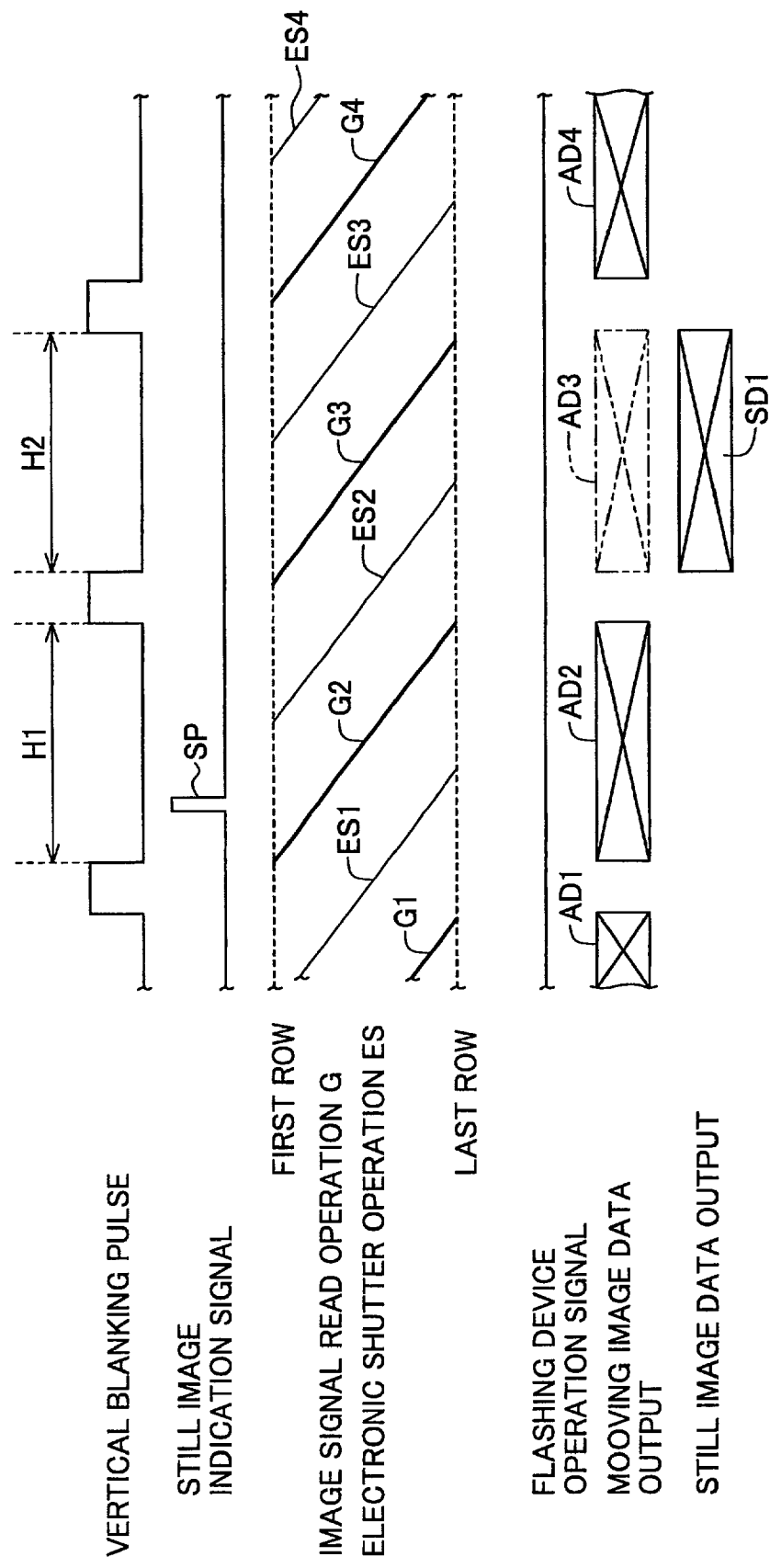

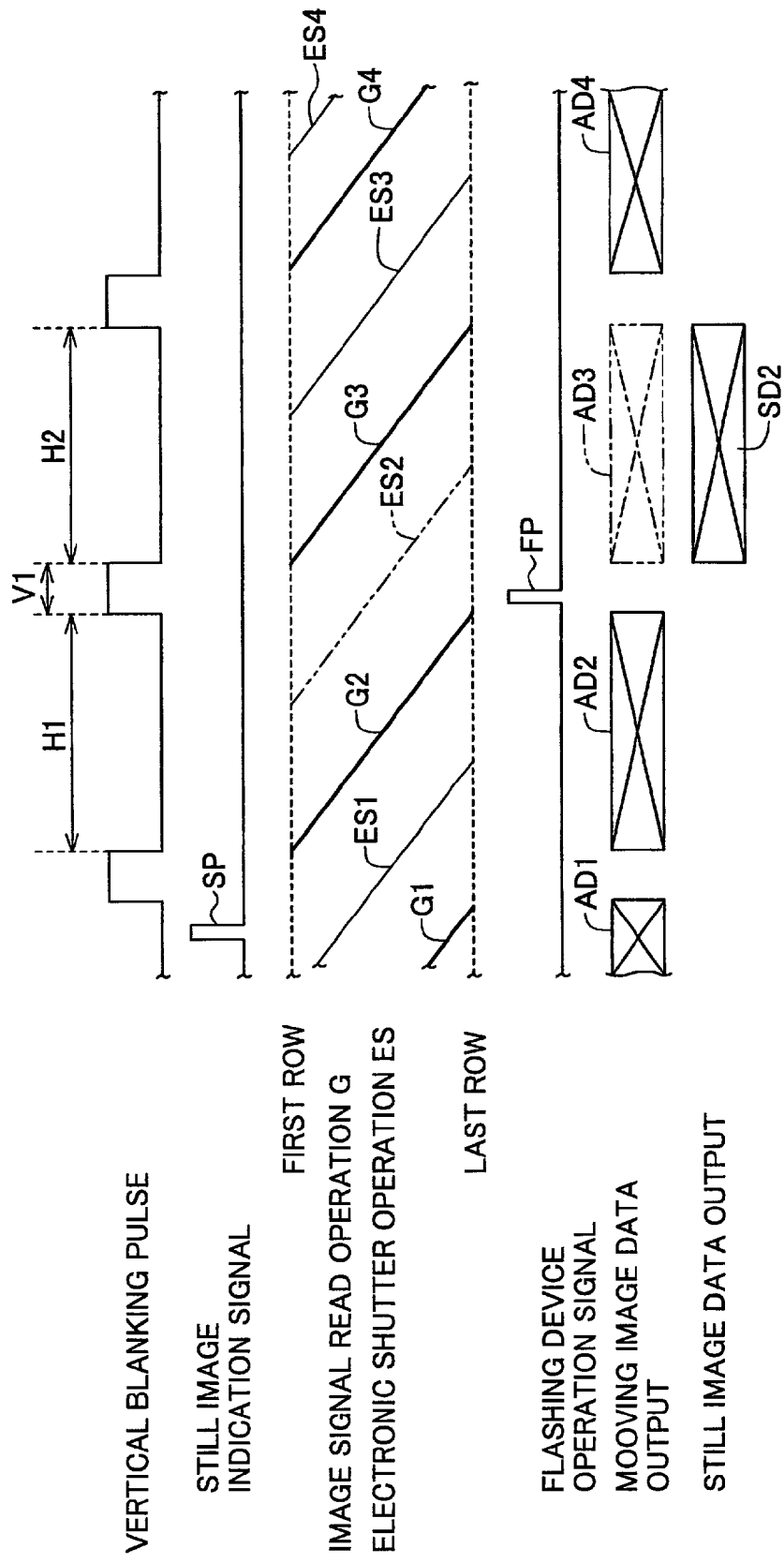

ELECTRONIC CAMERA WITH BACKLIGHT CORRECTION CAPABILITY

This application is based on Japanese Patent Application 2000-120507 filed on Apr. 21, 2000, the entire contents of which are incorporated herein by reference.

BACKGROUND OF THE INVENTION a) Field of the Invention

The present invention relates to an electronic camera, and more particularly to an electronic camera capable of obtaining moving image data and still image data by using a MOS (metal oxide semiconductor) type solid-state image pickup device.

b) Description of the Related Art

Since mass production techniques of CCD (charge coupled device) were established, apparatus utilizing a CCD type solid-state image pickup device as a line sensor or an area sensor has prevailed rapidly.

MOS type solid-state image pickup devices having a smaller consumption power than CCD type solid-state image pickup devices are under development with the advent of wide spreading personal digital assistants and the like. The consumption power of a MOS type solid-state image pickup device can be reduced, for example, about $\frac{1}{5}$ to $\frac{1}{10}$ of that of a CCD type solid-state image pickup device.

A MOS type solid-state image pickup device has: a semiconductor substrate; a number of photoelectric conversion elements (e.g., photodiodes) formed in one surface of the semiconductor substrate in a matrix shape along a plurality of rows and columns; a switching circuit formed at each photoelectric conversion element; an output signal line disposed for each photoelectric conversion column in the vicinity thereof; and the like. It is desired that the output signal line has a low electrical resistance, and this signal line is usually made of metal material.

In this specification, of the disposal directions of a number of photoelectric conversion elements formed in a matrix shape along a plurality of rows and columns, the disposal direction extending in the same direction as that of the output signal line is called a "photoelectric conversion element column direction" and the disposal of photoelectric conversion elements in this direction is called a "photoelectric conversion element column". The disposal direction crossing the photoelectric conversion element column is called a "photoelectric conversion element row direction" and the disposal of photoelectric conversion elements in this direction is called a "photoelectric conversion element row". If an output signal line is disposed in a zigzag way, the direction of a line approximating the overall extension direction of the output signal line is the extension direction of the output signal line.

Several MOS type solid-state image pickup devices having different structures are known. In one type of a MOS type solid-state image pickup device, each switching circuit includes an output transistor and a reset transistor. In the specification, the MOS type solid-state image pickup device is called where applicable a "MOS type solid-state image pickup device I".

In each switching circuit of the MOS type solid-state image pickup device I, the control terminal (gate electrode) of an output transistor is electrically connected to the photoelectric conversion element, and a load resistor is provided for each output signal line. As a voltage representing an amount of charge accumulated in the photoelectric conversion element is applied to the control terminal of the output transistor, an output signal is generated on the corresponding output signal line. This output signal is detected and converted to an analog voltage signal. The analog voltage signal is directly used as an image signal or converted into a digital signal to be used as the image signal.

Charges accumulated in the photoelectric conversion element do not disappear. It is therefore necessary that prior to generating the next output signal, the charge accumulated and held in the photoelectric conversion element even after the output signal is generated, are required to be drained to a predetermined line or the like. Draining the charge in the photoelectric conversion element is controlled by using the reset transistor. One reset transistor is provided for each photoelectric conversion element.

In an electronic camera having a moving image mode for outputting moving image data and a still image mode for outputting still image data, image pickup is generally and regularly performed in the moving image mode, and only when necessary, image pickup is performed in the still image mode. During the image pickup, an image signal read period and a vertical blanking period are alternately repeated.

In an electronic camera having a MOS type solid-state image pickup device, during each image signal read period, output signals necessary for image data of one frame are generated by the MOS type solid-state image pickup device.

If the MOS type solid-state image pickup device is the MOS type solid-state image pickup device I, output signals necessary for image data of one frame are sequentially generated on the output signal lines in the unit of a photoelectric conversion element row. The operation of the output transistors is controlled in the unit of the photoelectric conversion element row. A row selection signal line is provided for each photoelectric conversion element row. A row selection signal is supplied to the corresponding switching circuits via the row selection signal line to control the operation of the switching circuits.

In this specification, an operation of making the MOS type solid-state image pickup device generate output signals necessary for image data of one frame is called an "image signal read operation". One image signal read operation is performed during one image signal read period. Generally, when the image signal read period starts, the image signal read operation starts, and when the image signal read period ends, the image signal read operation ends. The length of one image signal read period is, for example, about $\frac{1}{60}$ sec to $\frac{1}{30}$ sec.

If a MOS type solid-state image pickup device is the MOS type solid-state image pickup device I, charge stored in the photoelectric conversion element can be drained by operating the reset transistor. As light continues to be incident upon the photoelectric conversion element, new charge accumulation starts after the charge is drained. An electronic shutter operation can be performed at a desired timing.

The electronic shutter operation is performed by sequentially controlling the operation of reset transistors, for example, in the unit of a photoelectric conversion element row. Charges accumulated in the photoelectric conversion elements are sequentially drained in the unit of a photoelectric conversion element row. A time taken to perform the electronic shutter operation for all photoelectric conversion element rows is approximately the same as that of the image signal read period. For example, the electronic shutter operation starts at a predetermined timing during the image signal read period and ends at a predetermined timing during the next image signal read period.

An exposure time of each photoelectric conversion element corresponds to a period from when the electronic shutter operation starts to when the next image signal read operation starts.

One reset signal line is provided for each photoelectric conversion element row to control the reset transistors. A reset signal is supplied to the corresponding reset transistors via the reset signal line.

When necessary, at a desired timing between the image signal read operation and the electronic shutter operation to follow, e.g., at a timing when output signals are generated on the output signal lines in the unit of a photoelectric conversion element row, charges accumulated in the photoelectric conversion elements from which the output signals were generated are drained to predetermined line or the like. An operation of generating output signals on the output signal lines and an operation of draining charges accumulating in the photoelectric conversion elements are performed in this order for each photoelectric conversion element row. At a predetermined timing thereafter, the electronic shutter operation is performed.

A readout row-shifter for supplying the row selection signal to each row selection signal line at a predetermined timing is formed in many cases on the same semiconductor substrate as the MOS type solid-state image pickup device. A reset row-shifter for supplying the reset signal to each reset signal line is formed in many cases on the same semiconductor substrate.

If an analog/digital converter (hereinafter abbreviated to "A/D converter") is provided for each output signal line, a digital signal can be obtained. The A/D converter outputs a digital signal representing an input analog signal, for example, to a buffer memory.

In a MOS type solid-state image pickup device having A/D converters, digital output signals from the A/D converters are used as the image signals.

The operations of each row-shifter, each A/D converter, and buffer memory are controlled by a controller. The controller is formed in many cases on the same semiconductor substrate.

In order to obtain a bright still image of an object in backlight, it is desired to use a strobe or a flash and avoid insufficient exposure of the object. A backlight correction is therefore desired.

Among electronic cameras utilizing a MOS type solid-state image pickup device conducting a row-sequential image signal read operation, electronic cameras having a backlight correction function have not been developed as yet.

SUMMARY OF THE INVENTION

It is an object of the present invention to provide an electronic camera utilizing a MOS type solid-state image pickup device which camera can generate backlight corrected still image data of an object.

According to one aspect of the present invention, there is provided an electronic camera comprising: a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically-connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals; an image signal processor for generating moving image data or still image data based on said image signals output from said MOS type solid-state image pickup device; a still image indication signal generator for generating a still image indication signal for indicating image pickup of a still image; a flashing device for emitting a flash in response to a reception of a predetermined signal, or a flashing device mount for mounting said flashing device; a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements; and a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type-solid-state image pickup device perform an image signal read operation of sequentially supplying said row selection signal from the readout row-shifter to each row selection signal line for sequentially generating said output signals on each output signal line.

Under the control of the correcting still image mode controller, the flashing device can be operated while the image signal read operation and electronic shutter operation are not performed, and the exposure time of each photoelectric conversion element can be made constant.

If the flashing device is operated while the electronic shutter operation is performed, the electronic shutter operation terminates before the flashing device is operated, for example, for the photoelectric conversion elements of the first to N-th rows (N is a positive integer), and the electronic shutter operation starts after the flashing device is operated for the photoelectric conversion elements of the (N+1)-th to last rows.

Therefore, an image signal of a backlight corrected object can be obtained from each photoelectric conversion element of the first to N-th rows, and an image signal of a backlight uncorrected object is obtained from each photoelectric conversion element of the (N+1)-th to last rows. Backlight corrected data and backlight uncorrected data are mixed in the image data of one frame, and an obtained still image is unnatural.

With the correcting still image mode controller, it is possible to prevent backlight corrected and uncorrected data from being mixed in the image data of one frame. Backlight correction and synchro-flash photography in the daytime can be realized.

The "flashing device" in this specification is used as a general term for a strobe and an electronic flash. The strobe is built in a camera or detachably mounted on a flashing device mount. The electronic flash is detachably mounted on the flashing device mount.

BRIEF DESCRIPTION OF THE DRAWINGS

FIG. 2 is a block diagram showing the outline of an electronic camera according to an embodiment.

FIG. 3 is a timing chart illustrating a relation between vertical blanking pulses, a still image indication signal, an operation of a MOS type solid-state image pickup device, a flashing device operation signal and an output from an image signal processor, during an operation of the electronic camera shown in FIG. 2 under the control of a moving image mode controller.

FIG. 4 is a timing chart illustrating a relation between vertical blanking pulses, a still image indication signal, an operation of a MOS type solid-state image pickup device, a flashing device operation signal and an output from an image signal processor, during an operation of the electronic camera shown in FIG. 2 under the control of a first still image mode (non-correcting still image mode) controller.

FIG. 5 is a timing chart illustrating a relation between vertical blanking pulses, a still image indication signal, an operation of a MOS type solid-state image pickup device, a flashing device operation signal and an output from an image signal processor, during an operation of the electronic camera shown in FIG. 2 under the control of a second still image mode (correcting still image mode) controller.

DETAILED DESCRIPTION OF THE PREFERRED EMBODIMENTS

Figure 1A:
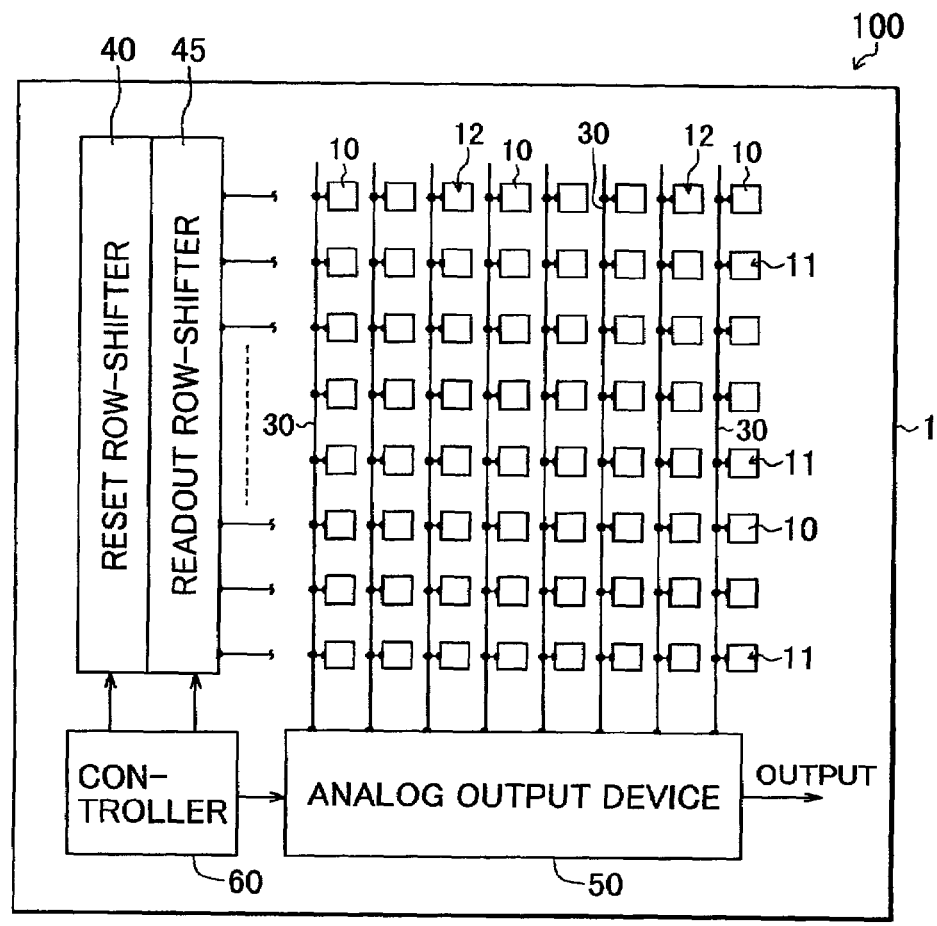
FIG. 1A is a schematic plan view showing an example of a MOS type solid-state image pickup device.
Figure 1B:
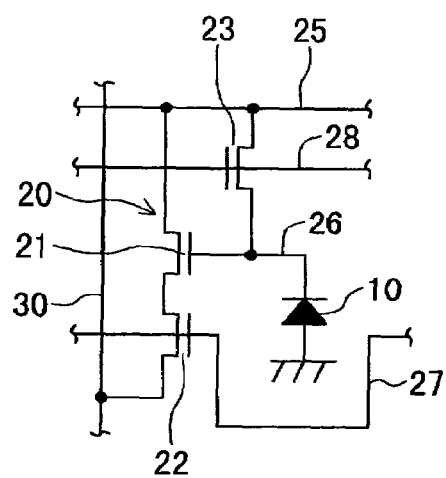
FIG. 1B is an equivalent circuit diagram of an example of a switching circuit of a MOS type solid-state image pickup device.

FIG. 1A is a schematic plan view showing an example of a MOS type solid-state image pickup device, and FIG. 1B is an equivalent circuit diagram of an example of a switching circuit of a MOS type solid-state image pickup device.

As shown in FIG. 1A, a MOS type solid-state image pickup device 100 has a number of photoelectric conversion elements 10 being composed of photodiodes and disposed in one surface of a semiconductor substrate 1 in a square matrix shape (including a matrix having the different numbers of rows and columns). A color filter and a micro lens may be disposed for each photoelectric conversion element thereover.

In the simplified structure shown in FIG. 1A, photoelectric conversion elements 10 totaling 64 elements are disposed in eight photoelectric conversion element rows 11 and eight photoelectric conversion element columns 12. In a practical MOS type solid-state image pickup device, the total number of photoelectric conversion elements is, for example, several hundred thousands to several millions.

Along one side of the semiconductor substrate 1, a reset row-shifter 40 and a readout row-shifter 45 are disposed in parallel. The reset row-shifter 40 can generate a reset signal in a row sequential order, and the readout row-shifter 45 can generate a row selection signal in the row sequential order. Along another side of the semiconductor substrate 1, an analog output device 50 is disposed which can output analog image signals serially. Near at one corner of the semiconductor substrate 1, a controller 60 is disposed which can control the operations of the reset row-shifter 40, readout row-shifter 45 and analog output device 50.

If the semiconductor substrate 1 is made of an n-type silicon substrate having a p-type impurity diffused region, each photoelectric conversion element 10 can be formed by forming an n-type impurity diffused region in a predetermined area of the p-type impurity diffused region. A photoelectric conversion element of a buried type photodiode can be formed by forming, for example, a $p^+$-type impurity diffused region on the surface of the n-type impurity diffused region.

Each photoelectric conversion element 10 is surrounded as viewed in plan by a channel stop region formed in the semiconductor substrate 1 or by a field oxide film formed on the semiconductor substrate 1. The channel stop region is made of, for example, a p⁺-type impurity diffused region. A p-type impurity concentration in the p⁺-type impurity diffused region is higher than that of the p-type impurity diffused region.

As shown in FIG. 1B, a switching circuit 20 is provided for each photoelectric conversion element 10. The switching circuit 20 includes an output transistor 21, a row selection transistor 22 and a reset transistor 23. For example, these transistors are MOS type transistors.

The output transistor 21 and row selection transistor 22 are serially connected each other and electrically connected to a constant voltage supply line 25 and an output signal line 30. The constant voltage supply line 25 is applied with, for example, a power supply voltage.

The control terminal (gate) of the output transistor 21 is electrically connected to the photoelectric conversion element 10 via a wiring line 26. The control terminal (gate) of the row selection transistor 22 is electrically connected to a row selection signal line 27. Part of the row selection signal line 27 may be structured as the gate electrode of the row selection transistor 22.

The reset transistor 23 is connected to the wiring line 26 and constant voltage supply line 25. The control terminal (gate) of the reset transistor 23 is electrically connected to a reset signal line 28. Part of the reset signal line 28 may be structured as the gate electrode of the reset transistor 23.

The constant voltage supply line 25 is provided, for example, for each photoelectric conversion element row 11 (refer to FIG. 1A), and extends along the photoelectric conversion element row 11. The constant voltage supply line 25 may be provided for each photoelectric conversion element column 12 (refer to FIG. 1A) and may extend along the photoelectric conversion element column 12.

The constant voltage supply line 25 is made of metal material such as aluminum, aluminum alloy, copper, copper alloy, tungsten, tungsten alloy, molybdenum, and molybdenum alloy.

The row selection signal line 27 is provided, for example, for each photoelectric conversion element row 11, and extends along the photoelectric conversion element row 11. One end of the row selection signal line 27 extends to the readout row-shifter 45 to be supplied with the row selection signal.

The reset signal line 28 is provided, for example, for each photoelectric conversion element row 11, and extends along the photoelectric conversion element row 11. One end of the reset signal line 28 extends to the reset row-shifter 40 to be supplied with the reset signal.

The reset signal line 28 and row selection signal line 27 are made of, for example, a polysilicon layer, a polycide layer (lamination of polysilicon and silicide), or a conductive metal material layer of tungsten, tungsten alloy, molybdenum, molybdenum alloy or the like.

The output signal line 30 is provided for each photoelectric conversion element column 12 and extends along the photoelectric conversion element column 12. One end of the output signal line 30 extends to the analog output device 50.

It is desired that the output signal line 30 has a low electrical resistance. It is desired that the output signal line 30 has a low electrical resistance particularly if an output signal is detected with flowing an electric current therethrough, in order to obtain a stable output. A low electrical resistance output signal line 30 can be formed by using metal material such as aluminum, aluminum alloy, copper, copper alloy, tungsten, tungsten alloy, molybdenum, and molybdenum alloy.

The constant voltage supply line 25, row selection signal line 27, reset signal line 28 and output signal line 30 may be formed on the semiconductor substrate 1 with electrically insulating layers being interposed therebetween. The output signal line 30 may be formed by using an inner conductive layer formed in the semiconductor substrate 1 and conductive layer over the semiconductor substrate 1. These lines are electrically insulated from each other excepting that the lines are electrically coupled via transistors.

The reset row-shifter 40 connected to one ends of the reset signal lines 28 is made of, for example, a shift register for receiving a control signal supplied from the controller 60 and performing a shift operation in response to a horizontal sync pulse, a logic circuit for generating the reset signal in accordance with an output signal from each stage of the shift register and the control signal, and other circuits. The operation of the reset row-shifter 40 is controlled by the controller 60.

The readout row-shifter 45 connected to one ends of the row selection signal lines 27 has a similar structure to that of the reset row-shifter 40. The operation of the readout row-shifter 45 is also controlled by the controller 60.

The analog output device 50 connected to one ends of the output signal lines 30 detects and converts the output signal generated on each output signal line 30 into an analog voltage signal and sequentially outputs this analog voltage signal. The analog voltage signals output from the analog output device 50 correspond to image signals.

The analog output device 50 is made of, for example, a load transistor provided for each output signal line 30, a capacitor provided for each load transistor, a sampling transistor provided for each capacitor, a sampling signal line connected to the control terminals (gates) of the sampling transistors, a circuit for generating a sampling signal, a shift register for sequentially selecting an analog voltage signal in response to a clock pulse, a circuit for generating a timing signal necessary for synthesizing a selected analog voltage signal and outputting it, and other circuits.

Figure 1C:
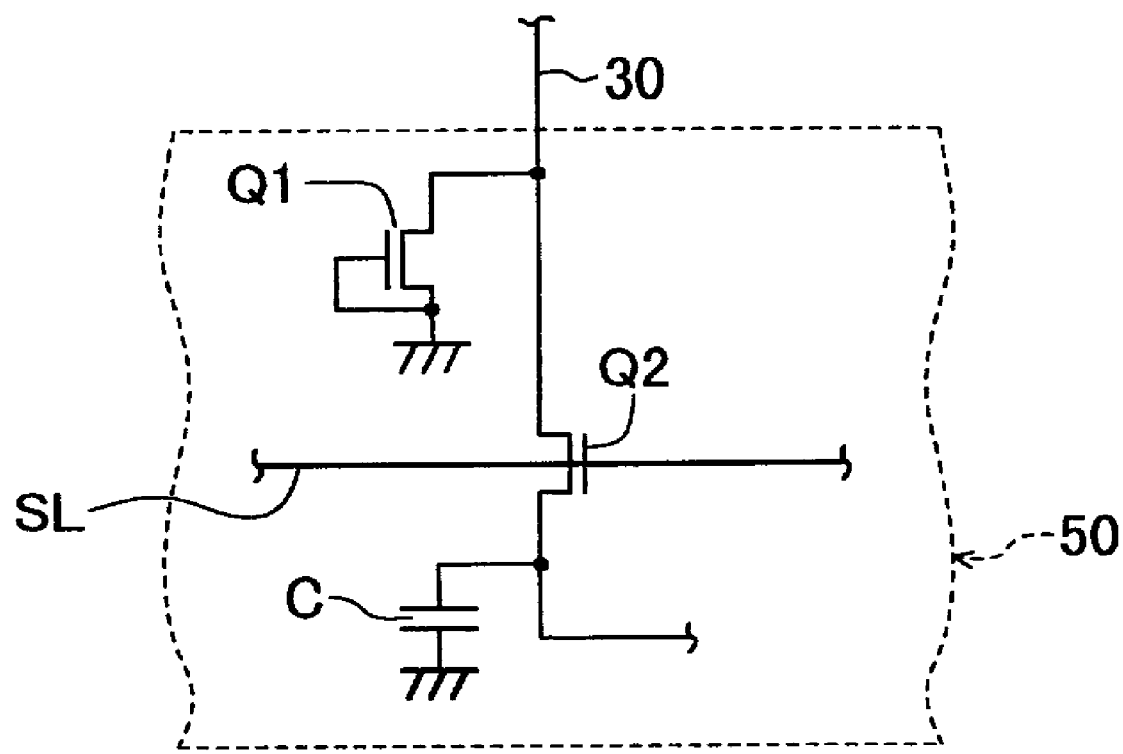
FIG. 1C is a circuit diagram showing a portion of an analog output device of a MOS type solid-state image pickup device shown in FIG. 1A.

As shown in FIG. 1C, a load transistor Q1, a capacitor C and a sampling transistor Q2 are connected to an output signal line 30. One sampling signal line SL is connected to all sampling transistors Q2.

The load transistor Q1 generates an electric signal (analog voltage signal) at the connection point to the output signal line 30 in accordance with a change in the resistance of the output transistor 21. The capacitor C samples/holds the analog voltage signal generated on the output signal line 30. The sampling transistor Q2 controls a supply of the analog voltage signal from the load transistor Q1 to the capacitor C, in accordance with a sampling control signal supplied from the controller 60 via a sampling control signal line SL.

The analog voltage signals held in the capacitors C are sequentially selected and synthesized by a shift register to form image signals. For example, a switching MOS transistor is disposed for each capacitor C and the switching MOS transistors are sequentially turned on to output the charges (analog voltage signals) held in the capacitors C as the image signals in the form of electric current. Alternatively, an amplification MOS transistor is disposed for each capacitor C and the voltage signals from the amplification MOS transistors are sequentially selected to output the voltage signals as the image signals.

The operation of the analog output device 50 is also controlled by the controller 60.

The controller 60 is composed of, for example, a clock counter, a reference voltage generator circuit, a clock generator circuit, a vertical/horizontal sync pulse generator circuit, various control signal generator circuits, and the like.

FIG. 2 is a block diagram showing the outline of an electronic camera according to an embodiment. As shown in FIG. 2, an electronic camera 200 of the embodiment includes a MOS type solid-state pickup device 100 shown in FIGS. 1A and 1b, an image pickup optical system 110, a moving image mode controller 120, a first still image mode controller 130, a second still image mode controller 135, a flashing device 140, a main controller 150, a first switching device 160, a second switching device 165, a still image mode designating device 170, a still image indication signal generator 175, an image signal processor 180, a photometer 185, a display 190 and the like. A storage medium 195 is provided if necessary.

The image pickup optical system 110 focuses an optical image on a MOS type solid-state image pickup device 100. For example, the image pickup optical system 110 is composed of optical lenses, a diaphragm, an optical low-pass filter and the like. In FIG. 2, the image pickup optical system 110 is represented generally by one optical lens. An arrow L in FIG. 2 represents light.

The MOS type solid-state image pickup device 100 converts an optical image focused by the image pickup optical system 110 into image signals and output the image signals.

Image signals output from the MOS type solid-state image pickup device 100 are sent to the image signal processor 180 which performs various processes such as interpolation and data compression, to obtain image data (moving image data or still image data). The image signal processor 180 outputs the image data to the display 190 or storage medium 195.

The moving image controller 120 drives the MOS type solid-state image pickup device 100 in the moving image mode and makes the image signal processor 180 output moving image data. The MOS type solid-state image pickup device 100 is regularly under a moving mode control by the moving mode controller 120 and alternately repeats the image signal read operation and electronic shutter operation.

The first still image mode controller 130 controls the MOS type solid-state image pickup device 100 to output still image signals of one frame, without activating the flashing device 140 such as a strobe. The first still image mode controller 130 also controls the image signal processor 180 to output still image data based on the still image signals. The first still image mode controller 130 is hereinafter called a "non-correcting still image mode controller" where appropriate.

The second still image mode controller 135 supplies the flashing device 140 such as a strobe with a flashing device operation signal and controls the MOS type solid-state image pickup device 100 to output still image signals of one frame. It is possible to activate the flashing device 140 and control the MOS type solid-state image pickup device 100 to output backlight corrected still image signals of one frame. The controller 135 also controls the image signal processor 180 to output still image data based on the still image signals. The second still image mode controller 135 is hereinafter called a "correcting still image mode controller" where appropriate.

The operation of the electronic camera 200 will be described by taking as an example the case wherein while the moving image mode controller 120 performs image signal read operations and electronic shutter operations corresponding to progressive scanning, the operation mode is switched to the mode by the non-correcting still image mode controller 130 or correcting still image mode controller 135.

FIG. 3 is a timing chart illustrating a relation between vertical blanking pulses, a still image indication signal, an operation of the MOS type solid-state image pickup device 100, a flashing device operation signal and an output from the image signal processor 180, during an operation of the electronic camera 200 under the control of the moving image mode controller 120.

A vertical blanking pulse has a potential of, for example, about 3 V. A continuation period of the vertical blanking pulse corresponds to a vertical blanking period. The vertical blanking period in the moving image mode is, for example, about 1 m-sec (milli-second).

A period from when the vertical blanking pulse falls to when the next vertical blanking pulse rises corresponds to the image signal read period. During the image signal read period, horizontal scanning periods as many as the number of photoelectric conversion element rows are continuously set with a horizontal blanking period being interpose between adjacent horizontal scanning periods. If the number of photoelectric conversion element rows is about 500, the length of one horizontal scanning period is about 60 and several µ-sec (micro-second), the length of one horizontal blanking period is about 10 and several µ-sec, and the length of one image signal read period is about 1/60 to 1/30 sec.

As indicated by straight lines in FIG. 3, a still image indication signal and flashing device operation signal are not generated. The image signal read timings of the MOS type solid-state image pickup device 100 are indicated by bold solid lines G1 to G4. The electronic shutter operation timings are indicated by thin solid lines ES1 to ES4. The "first row" in FIG. 3 means the first photoelectric conversion element row and the "last row" means the last photoelectric conversion element row (the eighth photoelectric conversion element row). An intermediate position between the first and last rows means a corresponding intermediate photoelectric conversion element row. For example, the first photoelectric conversion element row is nearest to the analog output device 50, and the last photoelectric conversion element row is farthest from the analog output device 50. These setting are also applied to FIGS. 4, 5, 7 and 9 to be described later.

The MOS type solid-state image pickup device 100 alternately repeats the image signal read operation and electronic shutter operation to sequentially output image signals. The lateral distance from the electronic shutter-operation ES to the next image signal read operation G as viewed in FIG. 3 corresponds to an exposure time.

The moving image mode controller 120 performs an AE operation of controlling the start timing of each electronic shutter operation so that the exposure condition is made in or near the optimum range.

On the basis of the image signals output from the MOS type solid-state image pickup device 100 through the image signal read operation G1, the image signal processor 180 outputs the moving image data AD1, and on the basis of the image signals output from the MOS type solid-state image pickup device 100 through the image signal read operation G2, the image signal processor 180 outputs the moving image data AD2. Similarly, on the basis of the image signals output from the MOS type solid-state image pickup device 100 through the image signal read operation G3, the image signal processor 180 outputs the moving image data AD3, and on the basis of the image signals output from the MOS type solid-state image pickup device 100 through the image signal read operation G4, the image signal processor 180 outputs the moving image data AD4. Still image data is not output.

Moving image data output from the image signal processor 180 is sent, for example, to the display 190 whereat the moving image is reproduced, or to the storage medium 195 in which the moving image data is recorded.

A still image is picked up by the electronic camera 200 under the control of the non-correcting still image mode controller 130 or correcting still image mode controller 135.

When a still image indication signal is made upon actuation of the still image indication signal generator 175 while the still image mode designating device 170 specifies the non-correcting still image mode controller 130, a control by the non-correcting still image mode controller 130 starts. By operating the electronic camera 200 under the control of the non-correcting still image mode controller 130, still image data is obtained without operating the flashing device 140 such as a strobe.

FIG. 4 is a timing chart illustrating a relation between vertical blanking pulses, a still image indication signal, an operation of the MOS type solid-state image pickup device 100, a flashing device operation signal and an output from the image signal processor 180, during an operation of the electronic camera 200 under the control of the non-correcting still image mode controller 130.

In FIG. 4, items common to those shown in FIG. 3 are represented by using identical terms and symbols to those of FIG. 3, and the description thereof is omitted.

The non-correcting still image mode controller 130 controls the electronic shutter operation which is performed first after the still image indication signal SP was made, i.e., the electronic shutter operation ES2 which starts during the image signal read period H1, and the image signal read operation G3 to be performed during the still image signal read period H2 set next to the image signal read period H1. The non-correcting still image mode controller 130 also controls the operation of the image signal processor 180.

Image signal read operations G1, G2 and G4 and electronic shutter operations ES1, ES3 and ES4 are controlled by the moving image controller 120.

The image signal read operation G3 to be controlled by the non-correcting still image mode controller 130 may be an image signal read operation satisfying interlace scanning, high speed thinning-out scanning or the like. However, the operation G3 is preferably an operation satisfying progressive scanning. The image signal read operations G1, G2 and G4 to be controlled by the moving image mode controller 120 may be an image signal read operation satisfying interlace scanning, high speed thinning-out scanning or the progressive scanning.

The non-correcting still image mode controller 130 may perform an AE operation of controlling the start timing of the electronic shutter operation ES2 so that the exposure condition is made in or near the optimum range.

On the basis of the image signals output from the MOS type solid-state image pickup device 100 through the image signal read operation G3, the image signal processor 180 outputs the still image data SD1, and on the basis of the image signals output through the image signal read operations G1, G2 and G4, the image signal processor 180 outputs the moving image data AD1, AD2 and AD4. The moving image data AD3 based on the image signals through the image signal read operation G3 is not output. However, the electronic camera 200 may be structured so that the moving image data AD3 is output.

When a still image indication signal is made upon actuation of the still image indication signal generator 175 while the still image mode designating device 170 specifies the correcting still image mode controller 135, a control by the correcting still image mode controller 135 starts. By operating the electronic camera 200 under the control of the correcting still image mode controller 135, still image data of a backlight corrected object image is obtained by operating the flashing device 140 such as a strobe.

FIG. 5 is a timing chart illustrating a relation between vertical blanking pulses, a still image indication signal, an operation of the MOS type solid-state image pickup device 100, a flashing device operation signal and an output from the image signal processor 180, during an operation of the electronic camera 200 under the control of the correcting still image mode controller 135.

In FIG. 5, items common to those shown in FIG. 4 are represented by using identical terms and symbols to those of FIG. 4, and the description thereof is omitted.

The correcting still image mode controller 135 controls the electronic shutter operation which is performed first after the still image indication signal SP was made, i.e., the electronic shutter operation ES2 which starts during the image signal read period H1, the image signal read operation G3 to be performed during the still image signal read period H2 set next to the image signal read period H1, and the operation of the flashing device 140. This control is performed also for the image signal read operation G2 during the image signal read period H1 and for the image signal processor 180.

Image signal read operations G1 and G4 and electronic shutter operations ES1, ES3 and ES4 are controlled by the moving image controller 120.

The correcting still image mode controller 135 performs the image signal read operation G2 in a manner similar to the moving image mode. However, the image signal read operation G2 essentially includes reset operations of draining charges accumulated in the photoelectric conversion elements in the unit of a photoelectric conversion element row after the output signals are generated. These reset operations are independent from the electronic shutter operation ES2. For example, the operation of generating output signals on the output signal lines and the reset operation are performed in this order in the unit of a photoelectric conversion element row.

In addition, the correcting still image mode controller 135 inhibits the electronic shutter operation ES2 which otherwise starts during the image signal read period H1 in the moving image mode, and the flashing device operation signal FP is output during the vertical blanking period V1 set between the image signal read period H1 and still image signal read period H2.

When the flashing device operation signal FP is output, the flashing device 140 such as strobe can be operated during the vertical blanking period V1. Although the length of the light emission time of the flashing device 140 changes with the performance and the like of the device 140, it may be several tens μ-sec to several m-sec. The time of the vertical blanking period V1 changes with the light emission time of the flashing device 140 and may be about 1 m-sec to 10 m-sec.

Excepting the above-described controls, the correcting still image mode controller 135 performs a similar control to that of the non-correcting still image mode controller 130. Since the flashing device 140 can be operated while the electronic shutter operation is inhibited, still image data of an object image uniformly backlight corrected can be obtained.

The solid-state image pickup device 100 performs the image signal read operation and electronic shutter operation, for example, in the following manner.

In the following description, for the purposes of convenience, the photoelectric conversion element rows 11 are called a first photoelectric conversion element row, a second photoelectric conversion element row, . . . , a seventh photoelectric conversion element row, and an eighth photoelectric conversion element row starting from the analog output device 50 side. The output transistors 21, row selection transistors 22, reset transistors 23, row selection signal line 27 and reset signal line 28 corresponding to the n-th (n is an integer from 1 to 8) are represented by adding "n-th" to the head of each term. A photoelectric conversion elements corresponding to the n-th photoelectric conversion element row are represented by adding "n-th" to the head of the term.

During the image signal read period, the controller 60 supplies a predetermined control signal to the readout row-shifter 45. In response to this control signal, the readout row-shifter 45 supplies the row selection signal in a predetermined order to the first row selection signal line 27 to eighth row selection signal line 27. The image signal read operation therefore starts.

When the row selection signal is supplied to the n-th row selection signal line 27, each of the n-th row selection transistors 22 is tuned on and electrically connected to the constant voltage supply line 25 and output signal line 30. A source follower amplifier constituted of the load transistor Q1 of the analog output device 50 and n-th output transistor 21 detects and converts the output signal generated on the corresponding output signal line 30 into an analog voltage signal. Intensity of this analog voltage signal changes with the amount of charge accumulated in the n-th row photoelectric conversion element 10.

The controller 60 controls the analog output device 50 to output the analog voltage signals. Image signals corresponding to the amount of charges accumulated in the n-th photoelectric conversion elements 10 are output from the analog output device 50.

Before the row selection signal is supplied to the (n+1)-th row selection signal line 27, the controller 60 controls the reset row-shifter 40 to supply the reset signal to the n-th reset signal line 28. When the reset signal is supplied to the n-th reset signal line 28, the n-th reset transistors 23 are turned on so that charges accumulated in the n-th row photoelectric conversion elements 10 are drained to the corresponding constant voltage supply line 25. The n-th row photoelectric conversion elements are therefore reset. The reset n-th photoelectric conversion elements can start the next charge accumulation after the supply of the reset signal is stopped.

The operation of generating output signals on the output signal lines and the reset operation are performed in this order for the first photoelectric conversion element row 11 to eighth photoelectric conversion element row 11 in the unit of a photoelectric conversion element row, to complete one image signal read operation satisfying progressive scanning.

The image signal read operation may be performed without the reset operations. Whether the reset operations are performed during the image signal read operation can be selected as desired. If the reset operations are not performed under the moving image mode control, the electronic shutter operation is essentially performed.

The electronic shutter operation starts at a predetermined timing from the photoelectric conversion element row 11 for which the image signal operation was completed, so that the exposure time of each photoelectric conversion element 10 becomes a predetermined time. If the exposure time is equal to the duration of the image signal read period, the reset operations during the image signal read operation corresponds to the electronic shutter operation.

If the exposure time is shorter than the duration of the image signal read period, the electronic shutter operation is performed at timing different from that of the reset operations during the image signal read operation.

The electronic shutter operation is similar to the reset operations. The electronic shutter operation starts at the intermediate timing during the image signal read period and terminates during the vertical blanking period following the image signal read period, or during the next image signal read period.

All or some of the moving image mode controller 120, first still image mode controller 130 and second still image mode controller 135 may be integrated on the same semiconductor chip as that of the MOS type solid-state image pickup device 100. The main controller 150 may also be integrated on the same semiconductor chip as that of the MOS type solid-state image pickup device 100.

One, two or three controller(s) for controlling the moving image mode and/or still image mode may be provided separately from the main controller 150 and the controller 60 of the MOS type solid-state image pickup device 100.

The main controller 150 is composed of, for example, a central processing unit (CPU).

Switching from the moving image mode control by the moving image mode controller 120 to the still image mode control by the first or second still image mode controller 130, 135 is performed by the first switching device 160, when the still image indication signal generator 175 including, for example, a shutter button and the like, makes the still image indication signal.

The first switching device 160 is composed of, for example, a selector switch, a flip-flop circuit and logic circuit, or the like.

By using the still image mode designating device 170, a user of the electronic camera 200 can designate to which one of the non-correcting still image mode controller 130 and correcting still image mode controller 135 is to be selected when the still image indication signal is made. Initial setting may be entered to select the non-correcting still image mode controller 130.

When the still image indication signal generator 175 is activated and the still image indication signal is made, the operation mode of the electronic camera 200 is switched to the still image mode under the control of the still image mode controller selected by the still image mode designating device 170 and the second switching device 165.

The still image mode designating device 170 may be composed of a switch button of a mode selector to be operated upon by a user of the electronic camera 200, a menu select switch to be operated and selected while viewing a menu display, or the like.

The second switching device 165 may be composed of a mode selector mounted on the camera body, a flip-flop circuit and logic circuit, or the like.

Switching from a control by the moving image controller 120 to a control by the non-correcting or correcting still image mode controller 130, 135 is performed in a very short time necessary for picking up a still image. Thereafter, the first switching device 160 switches to a control by the moving image mode controller 120.

The image signal processor 180 receives image signals output from the MOS type solid-state image pickup device 100, performs various processes such as interpolation and data compression, and outputs image data (moving image data or still image data) having a predetermined format. The image signal processor 180 supplies the main controller 150 with information such as the amount of obtained image data, a completion signal representative of each image signal processing step, and error signals of image signal processing.

The photometer 185 receives a predetermined signal, e.g., a luminance signal, from the image signal processor 180, and produces a numeric value for an exposure condition at image pickup. A photometry method such as center area emphasizing photometry and divisional area photometry is known. The photometer 185 supplies the value for the exposure condition to the main controller 150.

On the basis of the value for the exposure condition, the main controller 150 selects the optimum exposure condition and notifies it to the moving image mode controller 120, non-correcting still image mode controller 130 and correcting still image mode controller 135. Each of the moving image mode controller 120, non-correcting still image mode controller 130 and correcting still image mode controller 135 may perform an AE operation of controlling the start timing of the electronic shutter operation or the timing of draining charges during the electronic shutter operation in the unit of a photoelectric conversion element row, so that the exposure condition is made in or near the optimum range.

Moving image data output from the image signal processor 180 is supplied to the display 190 whereat moving images are reproduced, or compressed image data is supplied to the storage medium 195 in which the data is recorded. Still image data output from the image signal processor is processed in a manner similar to the above.

The display 190 may be a liquid crystal display, an electroluminescence (EL) display, a plasma display, a cathode-ray tube or the like.

The storage medium 195 may be a non-volatile memory such as a memory card, a memory stick, a compact flash memory; a memory tape; a memory disc; a floppy disc; a hard disc; a magneto optical recording medium; an optical recording media (DVD-RAM, CD-R, CD-RW, etc.) or the like.

A timing signal generator TG (refer to FIG. 2) is also provided. The timing signal generator TG generates a clock pulse signal and the like to synchronize the operation of each block of the electronic camera 200, and supplies them to the MOS type solid-state image pickup device 100, image signal processor 180 and the like.

Figure 6:
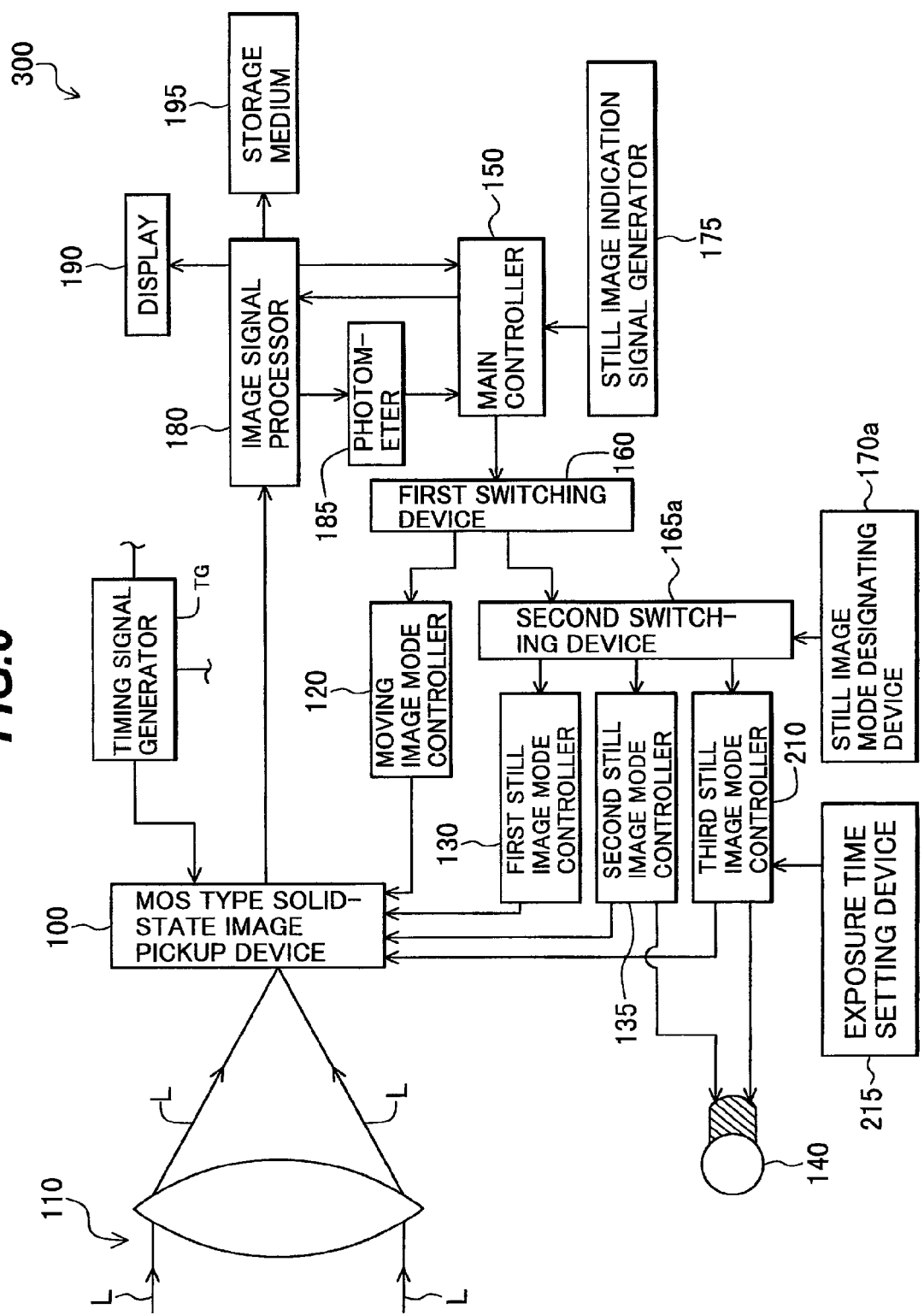
FIG. 6 is a block diagram showing the outline of an electronic camera according to another embodiment.

FIG. 6 is a block diagram showing the outline of an electronic camera according to another embodiment. As shown, an electronic camera 300 of this embodiment has a third still image mode controller 210 added to the electronic camera 200 shown in FIG. 2.

The other structures are common to those of the electric camera 200. In FIG. 6, like constituent elements to those shown in FIG. 2 are represented by using identical reference numerals and the description thereof is omitted.

Since the third still image mode controller 210 is newly added, the functions of the second switching device and still image mode designating device are modified more or less. From this reason, the second switching device is represented by a new reference symbol "165a" and the still image mode designating device is represented by a new reference symbol "170a".

Similar to the second still image mode controller 135 described earlier, the third still image mode controller 210 supplies the flashing device operation signal to the flashing device 140 such as a strobe and controls the MOS type solid-state image pickup device 100 to output still image signals of one frame. It is possible to operate the flashing device 140 and make the MOS type solid-state image pickup device 100 output backlight corrected still image signals of one frame. The third still image mode controller 210 also controls the image signal processor 180 to output still image data based on the still image signals.

The exposure time under the control of the second still image mode controller (correcting still image mode controller) 135 is a total sum of one image signal read period and one vertical blanking period.

In contrast to the above, the third still image mode controller 210 controls the MOS type solid-state image pickup device 100 in such a manner that the exposure time is longer than a total sum of two image signal read periods.

In order to make the exposure time variable under the control by the third still image mode controller 210, for example, the electronic camera 300 is provided with an exposure time setting device 215. The exposure time setting device 215 may be composed of a dial switch or a jog dial switch operable by a user of the electronic camera 300, or a select switch allowing a user to select an exposure time while viewing a monitor display.

The whole or portion of the third still image mode controller 210 may be integrated on the same semiconductor chip as that of the MOS type solid-state image pickup device 100. The third still image mode controller 210 may be provided separately from the controller 60 of the MOS type solid-state image pickup device 100 and the main controller 150.

The second switching device 165a is structured so that the moving image control by the moving image mode controller 120 can be switched to any one of the controls by the first, second, and third still image mode controllers 130, 135 and 210.

The still image mode designating device 170a is structured so that it is possible to designate whether the MOS type solid-state image pickup device 100 is operated under which of the first, second and third still image mode controllers 130, 135 and 210.

The operation of the electronic camera 300 shown in FIG. 6 is similar to that of the electronic camera 200 shown in FIG. 2, excepting the operation under the control by the third still image mode controller 210.

When a still image indication signal is made upon actuation of the still image indication signal generator 175 while the still image mode designating device 170 specifies the third still image mode controller 210, a control by the third still image mode controller 210 starts. By operating the electronic camera 300 under the control of the third still image mode controller 210, still image data of a backlight corrected and long-time exposed object image is obtained by operating the flashing device 140 such as a strobe.

The operation of the electronic camera 300 will be described by taking as an example the case wherein while the moving image mode controller 120 performs image signal read operations and electronic shutter operations corresponding to progressive scanning, the operation mode is switched to the mode by the third still image mode controller 210.

Figure 7:
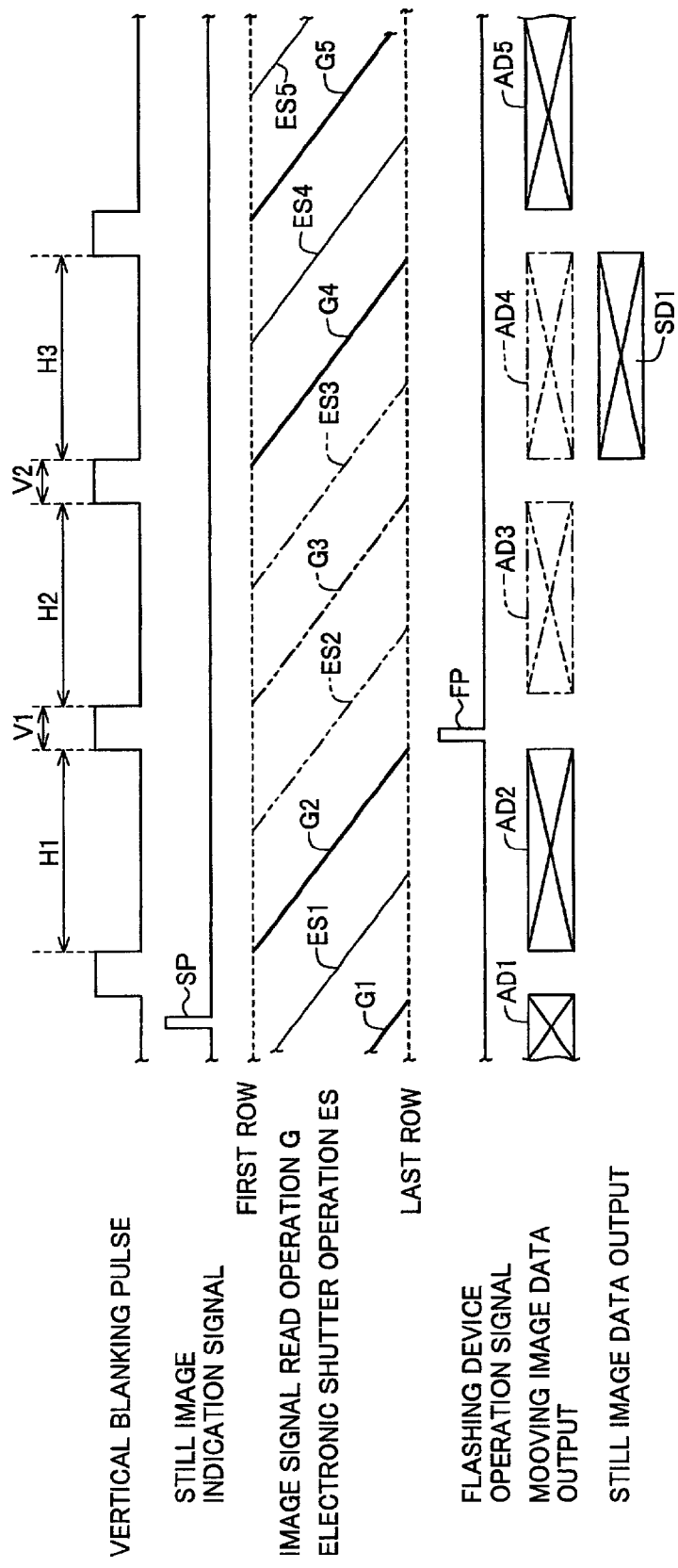
FIG. 7 is a timing chart illustrating a relation between vertical blanking pulses, a still image indication signal, an operation of a MOS type solid-state image pickup device, a flashing device operation signal and an output from an image signal processor, during an operation of the electronic camera shown in FIG. 6 under the control of a third still image mode controller.

FIG. 7 is a timing chart illustrating a relation between vertical blanking pulses, a still image indication signal, an operation of the MOS type solid-state image pickup device 100, a flashing device operation signal and an output from the image signal processor 180, during an operation of the electronic camera 300 under the control of the third still image mode controller 210.

In FIG. 7, items common to those shown in FIG. 4 are represented by using identical terms and symbols to those of FIG. 4, and the description thereof is omitted.

The third still image mode controller 210 controls the electronic shutter operation which is performed first after the still image indication signal SP was made, i.e., the electronic shutter operation ES2 which starts during the image signal read period H1, the image signal read operation G3 to be performed during the image signal read period H2 set next to the image signal read period H1, the electronic shutter operation ES3 to be performed during the image signal read period H2, and the still image signal read operation G4 to be performed during the still image signal read period H3 which is set third after the still image indication signal SP was made. The third still image mode controller 210 also controls the image signal read operation G2, the flashing device 140 and the image signal processor 180.

Image signal read operations G1 and G5 and electronic shutter operations ES1, ES4 and ES5 are controlled by the moving image controller 120.

The third still image mode controller 210 performs the image signal read operation G2 in a manner similar to the moving image mode. However, the image signal read operation G2 essentially includes reset operations of draining charges accumulated in the photoelectric conversion elements in the unit of a photoelectric conversion element row after the output signals are generated. These reset operations are independent from the electronic shutter operation ES2. For example, the operation of generating output signals on the output signal lines and the reset operation are performed in this order in the unit of a photoelectric conversion element row.

In addition, the third still image mode controller 210 inhibits the electronic shutter operation ES2 which otherwise starts during the image signal read period H1 in the moving image mode, and the flashing device operation signal FP is output during the vertical blanking period V1 set between the image signal read period H1 and image signal read period H2. The third still image mode controller 210 also inhibits the image signal read operation G3 which is otherwise performed during the image signal read period H2 under the moving image mode and the electronic shutter operation ES3 which otherwise starts during the image signal read period H2 in the moving image mode. The image signal read operation G4 is performed during the still image signal read period H3 set after the image signal read period H2 with the vertical blanking period V2 being interposed.

The image signal processor 180 outputs the still image data SD1 based on the image signals output from the MOS type solid-state image pickup device 100 through the image signal read operation G4. The image signal processor 180 also outputs moving image data AD1, AD2 and AD5 based on the image signals output through the other image signal read operations G1, G2 and G5. The moving image data AD4 based on the image signals through the image signal read operation G4 is not output. However, the electronic camera 300 may be structured so that the moving image data AD4 is output.

Excepting the above-described controls, the third still image mode controller 210 controls in a similar manner to the first still image mode controller (non-correcting still image mode controller) 130.

The image signal processor 180 therefore outputs the still image data SD1 based on the image signals representing charges accumulated in the photoelectric conversion elements under the condition of an exposure time longer than a total sum of two image signal read periods.

When the flashing device operation signal FP is output, the flashing device 140 such as strobe can be operated during the vertical blanking period V1. Since the flashing device 140 can be operated while the electronic shutter operation is inhibited, still image data of an object image uniformly backlight corrected can be obtained. Since the exposure time can be set longer than a total sum of two image signal read periods, a backlight corrected object image and a relatively clear background can be obtained even if the distance between the object and background is long and the background is a dark scene.

In the example shown in FIG. 7, the still image data SD1 is obtained at an exposure time which is a total sum of two image signal read periods and two vertical blanking periods. The exposure time for obtaining still image data may be set longer than a total sum of three image signal read periods.

Figure 8:
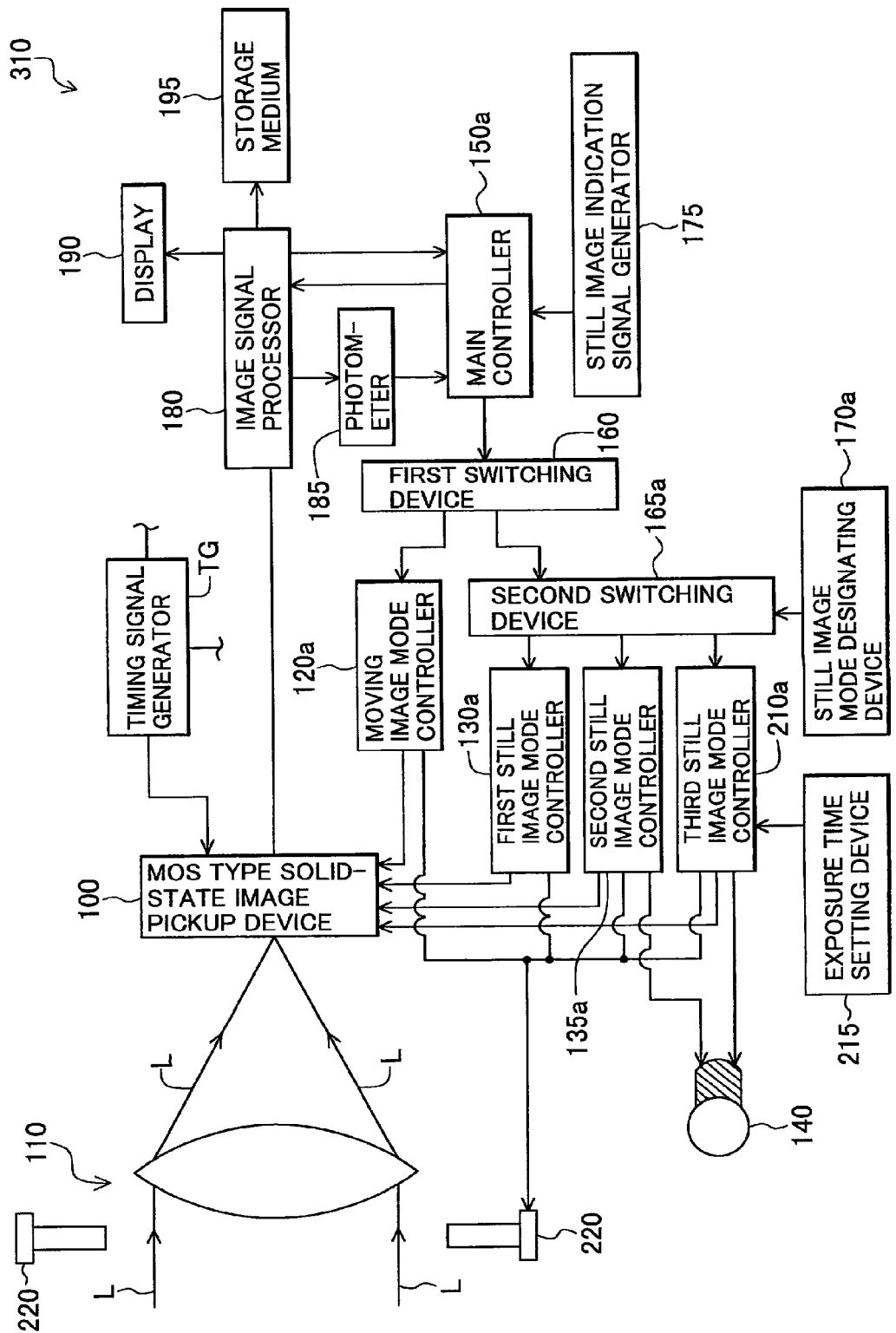
FIG. 8 is a block diagram showing the outline of an electronic camera according to still another embodiment.

FIG. 8 is a block diagram showing the outline of an electronic camera according still another embodiment. As shown, an electronic camera 310 of this embodiment has an auto iris 220 newly added to the electronic camera 300 shown in FIG. 6.

Since the other structures of the electronic camera 310 are common to those of the electronic camera 300 shown in FIG. 6, like constituent elements to those shown in FIG. 6 are represented by using identical reference numerals and the description thereof is omitted.

Since the auto iris 220 is newly added, the functions of the moving image mode controller, first to third still image controllers and the main controller are modified more or less. From this reason, these controllers are represented by new reference symbols.

Upon reception of the values representative of the exposure condition from the photometer 185, the main controller 150a of the electronic camera 310 shown in FIG. 8 judges from the values whether the exposure condition is in the optimum range, and supplies the judgment result to the moving image mode controller 120a and first still image mode controller 130a as well as the second and third still image mode controllers 135a and 210a. This operation differs from that of the main controller 150 shown in FIG. 6.

The moving image mode controller 120a and first still image mode controller (non-correcting still image mode controller) 130a can control an open/close operation of the auto iris 220 in addition to the AE operation. This point differs from the operation of the moving image mode controller 120 and first still image mode controller 130 shown in FIG. 6.

In this specification, an operation of adjusting an exposure amount of the photoelectric conversion element 10 in the MOS type solid-state image pickup device 100 by controlling an open/close state of the auto iris is called an exposure amount adjustment operation. This exposure amount adjustment operation is hereinafter called "AI operation" where appropriate.

The second still image mode controller (correcting still image mode controller) 135a and third still image mode controller 210a can also perform the AI operation. This point differs from the operation of the second and third still image mode controllers 135 and 210 shown in FIG. 6.

Since the moving image mode controller 120a and first to third still image controllers 130a, 135a and 210a can perform the AI operation, the exposure amount of the photoelectric conversion elements 10 can be controlled more accurately than that of the electronic camera 300 shown in FIG. 6.

Excepting these points, the electronic camera 310 shown in FIG. 8 operates in a manner similar to the electronic camera 300 shown in FIG. 6.

The operation of the electronic camera 310 will be described by taking as an example the case wherein while the moving image mode controller 120a performs image signal read operations and electronic shutter operations corresponding to progressive scanning, the operation mode is switched to the mode by the second still image mode controller 135a.

Figure 9:
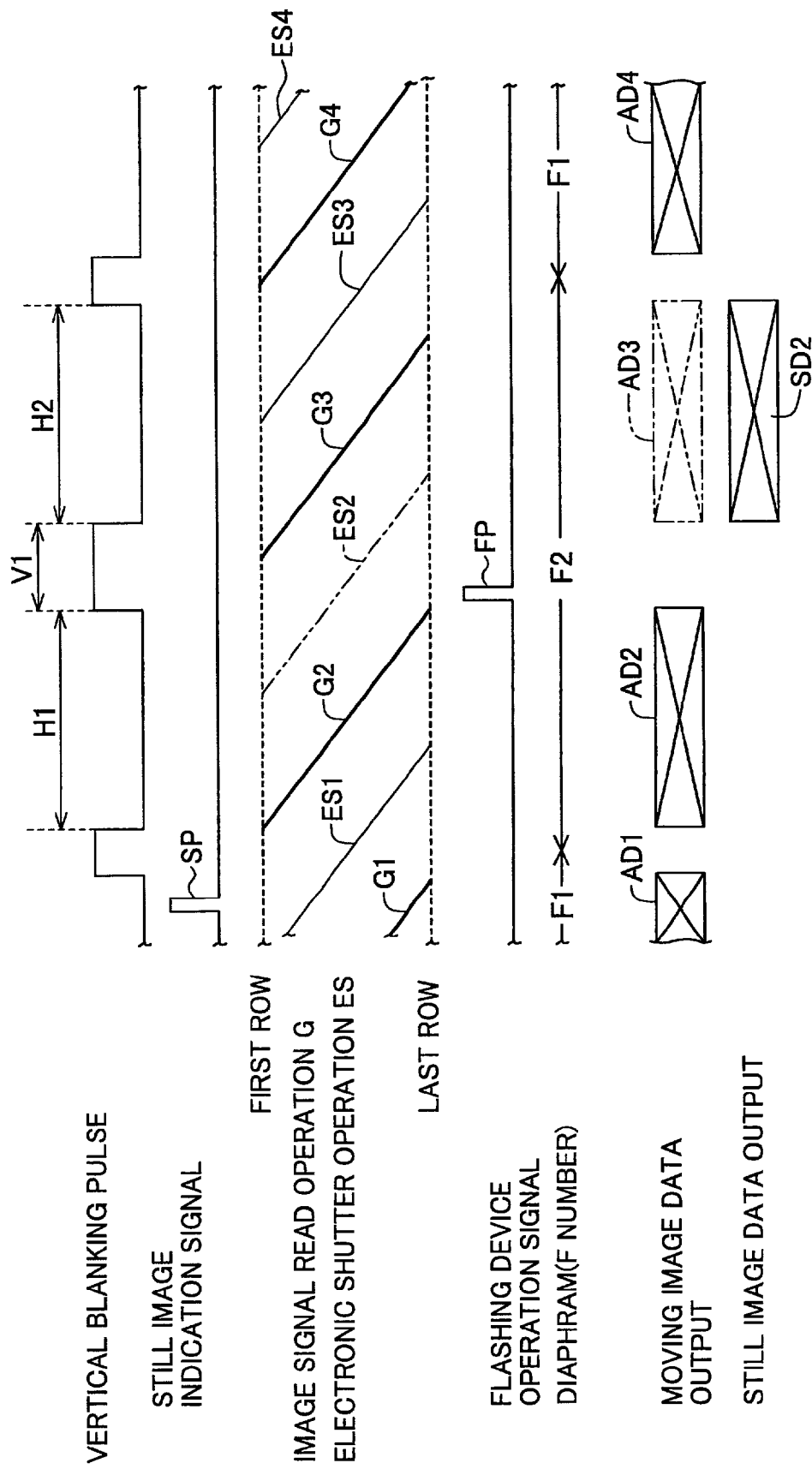
FIG. 9 is a timing chart illustrating a relation between vertical blanking pulses, a still image indication signal, an operation of a MOS type solid-state image pickup device, a flashing device operation signal, a diaphragm (F number) of an image pickup optical system and an output from an image signal processor, during an operation of the electronic camera shown in FIG. 8 under the control of the second still image mode (correcting still image mode) controller.

FIG. 9 is a timing chart illustrating a relation between vertical blanking pulses, a still image indication signal, an operation of the MOS type solid-state image pickup device 100, a flashing device operation signal, a diaphragm (F number) of the image pickup optical system 110, and an output from the image signal processor 180, during an operation of the electronic camera 310 under the control of the second still image mode controller 135a.

In FIG. 9, items common to those shown in FIG. 5 are represented by using identical terms and symbols to those of FIG. 5, and the description thereof is omitted.

The second still image mode controller 135a controls an image signal read operation G2, an electronic shutter operation ES2, an image signal read operation G3, the flashing device 140, auto iris 220 and image signal processor 180. Image signal read operations G1 and G4 and electronic shutter operations ES1, ES3 and ES4 are controlled by the moving image mode controller 120a.

An exposure time under the control of the second still image mode controller 135a corresponds to the lateral distance from the image signal read operation G2 to the next image signal read operation G3, i.e., a total sum of one image signal read period and one vertical blanking period. This exposure time is longer than the exposure time under the control of the moving image mode controller 120a.

Therefore, if the AI operation is not performed, an optimum exposure condition may not be obtained under the control of the second still image mode controller 135a even if an optimum exposure condition is obtained under the control of the moving image mode controller 120a.

In order to obtain an optimum exposure condition, the second still image mode controller 135a starts the AI operation before the image signal read operation G2 starts after the still image indication signal SP was made. The auto iris 220 is moved toward a close state so that the exposure condition is in or near the optimum range. The diaphragm (F number) of the image pickup optical system 110 is set to a value F2 larger than F1 under the moving image mode control by the moving image mode controller 120a.

Still image data SD2 capable of reproducing a still image having a more proper exposure or an exposure nearer to it can be obtained than still image SD1 under the control of the second still image mode controller 135 shown in FIG. 5.

The AI operation by the second still image mode controller 135a terminates at the same time when the image signal read operation G3 is terminated or before the image signal read operation G4 starts after the completion of the image signal read operation G3. After the AI operation is terminated, the AI operation by the moving image mode controller 120a starts.

The electronic cameras according to the embodiments have been described above. The invention is not limited only to the above-described embodiments.

For example, the structure of the MOS type solid-state image pickup device may be changed as desired so long as the device can perform both the image signal read operation of sequentially generating output signals each representing the charge amount of the photoelectric conversion element in the unit of a photoelectric conversion element row and the electronic shutter operation of sequentially draining the charges accumulated in each photoelectric conversion element in the unit of a photoelectric conversion element row.

The photoelectric conversion elements may be disposed in a pixel shift layout instead of a square matrix layout.

In this specification, the "pixel shift layout" is intended to mean a layout of a number of pixels in which each of the photoelectric conversion elements constituting a photoelectric conversion element column of an odd number is shifted from each of the photoelectric conversion elements constituting a photoelectric conversion element column of an even number by about a half of the pitch $P_1$ between the photoelectric conversion elements in each column, each of the photoelectric conversion elements constituting a photoelectric conversion element row of an odd number is shifted from each of the photoelectric conversion elements constituting a photoelectric conversion element row of an even number by about a half of the pitch $P_2$ between the photoelectric conversion elements in each row, and each photoelectric conversion element row includes only the photoelectric conversion elements of the odd or even column. The pitches $P_1$ and $P_2$ may take the same value or different values.

The clause "about a half of the pitch $P_1$ between the photoelectric conversion elements" is intended to include $P_1/2$ and other values which can be substantially considered to be equivalent to $P_1/2$ in terms of the performance of the solid image pickup device and the image quality although the pitch is shifted from $P_1/2$ because of manufacture errors, rounding errors of pixel positions caused by design or mask, and the like. The clause "about a half of the pitch $P_2$ between the photoelectric conversion elements" is also intended to mean the above-described definition.

In performing the image signal read operation and electronic shutter operation in the unit of a photoelectric conversion element row, it is preferable to provide each photoelectric conversion element with a switching circuit as in the embodiment MOS type solid-state image pickup device 100. The switching circuit may include four transistors in place of three transistors.

Figure 10:
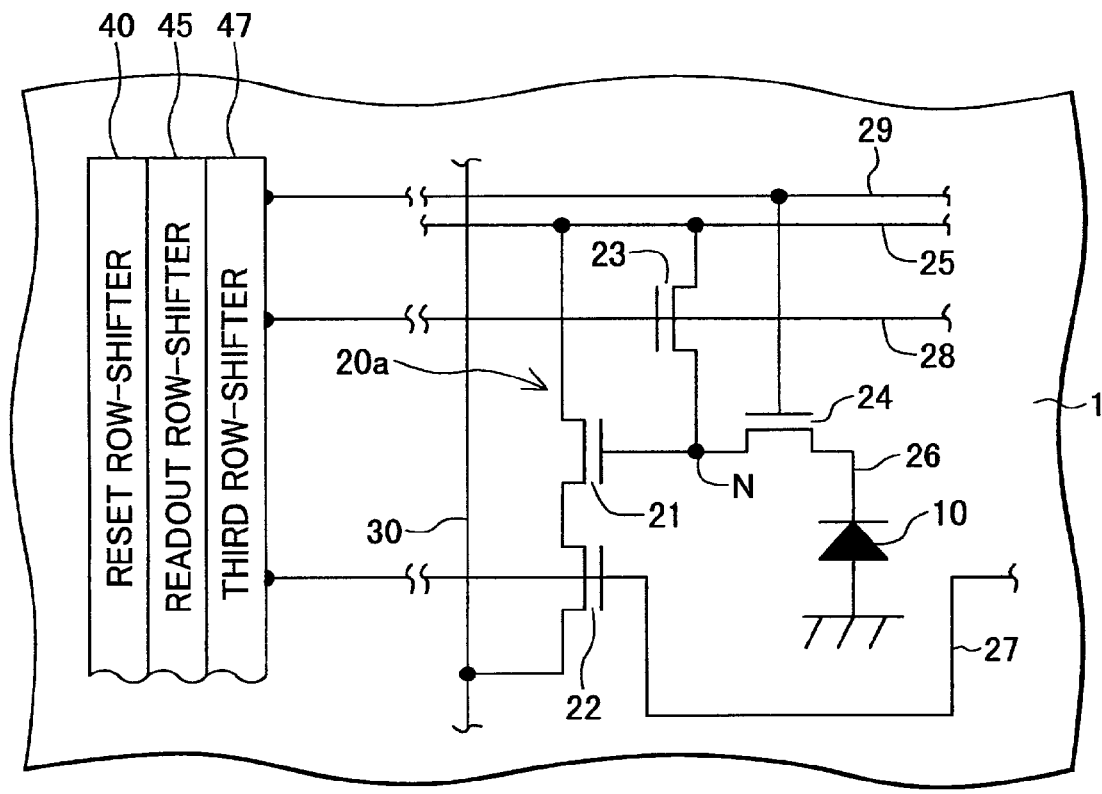
FIG. 10 is an equivalent circuit diagram showing an example of a switching circuit constituted of four transistors.

FIG. 10 is an equivalent circuit diagram showing an example of a switching circuit including four transistors. A switching circuit 20a shown in FIG. 10 has a charge transfer transistor 24 and a transfer control signal line 29 added to the switching circuit 20 shown in FIG. 1B.

In FIG. 10, like constituent elements to those shown in FIG. 1B are represented by using identical reference numerals and the description thereof is omitted.

The charge transfer transistor 24 is disposed between the corresponding photoelectric conversion element 10 and a connection point N. The connection point N is a connection point between a wiring line 26 and a reset transistor 23. The control terminal (gate) of the charge transfer transistor 24 is electrically connected to the corresponding transfer control signal line 29. Part of the transfer control signal line 29 may be structured as the gate electrode of the charge transfer transistor 24. For example, the charge transfer transistor 24 is a MOS transistor.

The transfer control signal line 29 is provided for each photoelectric conversion element row and extends along the corresponding photoelectric conversion element row.

The transfer control signal line 29 is made of conductive material such as polysilicon, polycide, aluminum, tungsten, tungsten alloy, molybdenum, and molybdenum alloy. The transfer control signal line 29 is electrically insulated by unrepresented electric insulating layers from other wiring layers and semiconductor substrate.

If the switching circuit 20a is provided for each photoelectric conversion element 10 of the MOS type solid-state image pickup device 100 shown in FIG. 1A, a third row-shifter 47 (refer to FIG. 10) is formed on the semiconductor substrate 1. Each transfer control signal line 29 is electrically connected to the third row-shifter 47.

The third row-shifter 47 supplies a transfer control signal to each transfer control signal line 29 at a predetermined timing. The operation of the third row-shifter 47 is controlled, for example, by the controller 60.

The image signal read operation is performed, for example, in the following manner.

First, the readout row-shifter 45 supplies a row selection signal to the row selection signal line 27 corresponding to the first photoelectric conversion element row 11 so that the corresponding row selection transistors 22 turn on and the output transistor 21 is connected to the output signal line 30 via the row selection transistor 22.

Next, the reset row-shifter 40 supplies a reset signal to the reset signal line 28 corresponding to the first photoelectric conversion element row 11 so that the corresponding reset transistors 23 turn on and unnecessary charges in the gates of the output transistors 21 corresponding to the reset transistors 23 are drained to the corresponding constant voltage supply line 25.

After the reset signal is supplied, the third row-shifter 47 supplies a transfer control signal to the transfer control signal line 29 corresponding to the first photoelectric conversion element row 11 so that the corresponding charge transfer transistors 24 turn on. A voltage corresponding to the amount of charge accumulated in the photoelectric conversion element 10 is applied to the gate of the corresponding output transistor 21 and the electrical resistance of the output transistor 21 changes. The output transistor 21 and the load resistance of the analog output device 50, e.g., load transistor Q1, are electrically connected to the constant voltage supply line 25 and ground to constitute a source follower amplifier. An output signal representing the amount of charge accumulated in photoelectric conversion element 10 of the first photoelectric conversion element row 11 is generated on the corresponding output signal line 30.

The above-described operation is sequentially performed for the second to last photoelectric conversion element rows to complete the image signal read operation.

If necessary, immediately after the output signals are generated on the output signal lines 30 in the unit of a photoelectric conversion element row, charges accumulated in each photoelectric conversion element 10 of this row are drained to the constant voltage supply line 25.

Draining charges in the unit of a photoelectric conversion element row 11 is performed, for example, in the following.

First, the reset row-shifter 40 supplies a reset signal to the reset signal line 28 corresponding to the photoelectric conversion element row 11 from which charges accumulated in the photoelectric conversion elements 10 are to be drained (hereinafter called an "N-th photoelectric conversion element row 11"), so that the corresponding reset transistors 23 turn on.

Next, the third row-shifter 47 supplies a transfer control signal to the transfer control signal line 29 corresponding to the N-th photoelectric conversion element row 11. The corresponding charge transfer transistors 24 therefore turn on and charges accumulated in the N-th row photoelectric conversion elements 10 are drained to the constant voltage supply line 25. The N-th row photoelectric conversion elements 10 are therefore reset.

A portion of charge may remain in the gate of the corresponding output transistor 21. However, this charge is drained to the constant voltage supply line 25 at the initial stage of the next image signal read operation for the N-th photoelectric conversion element row 11. Therefore, an output signal representing a charge mixed with the remained charge will not be generated during the next image signal read operation for the N-th photoelectric conversion element row 11.

The reset signal and transfer control signal used for draining charges accumulated in the N-th row photoelectric conversion elements 10 may be applied at different timings if the reset signal is applied first, or they may be applied in an overlap manner.

In the electronic shutter operation, the above-described draining (reset) operation is sequentially performed from the first to the last photoelectric conversion element rows.

The switching circuit provided for each photoelectric conversion element may include only one transistor.

Figure 11:
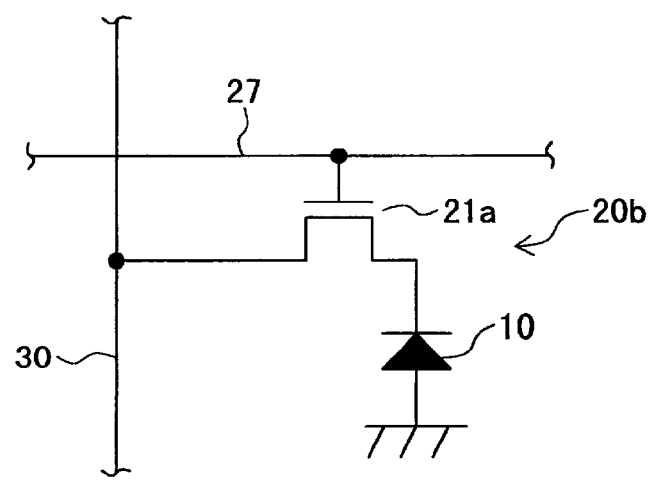
FIG. 11 is an equivalent circuit diagram showing an example of a switching circuit constituted of one transistor.

FIG. 11 is an equivalent circuit diagram showing an example of the switching circuit including only one transistor. In FIG. 11, like constituent elements—to those shown in FIG. 1B are represented by using identical reference symbols and the description thereof is omitted.

A switching circuit 20b shown in FIG. 11 has a transistor 21a connected to the photoelectric conversion element 10 and output signal line 30. The row selection signal line 27 is electrically connected to the control terminal (gate) of the transistor 21a. Part of the row selection signal line 27 may be structured as the gate electrode of the transistor 21a.

When a predetermined voltage is applied to the row selection signal line 27, charge accumulated in the photoelectric conversion element 10 is read to the corresponding output signal line 30 and an output signal (electric current signal) flows in the output signal line 30. This electric current signal is directly used as an image signal or converted into a digital signal to be used as an image signal. The image signal read operation can be performed in the unit of a photoelectric conversion element row.

During the electronic shutter operation, each output signal line 30 is electrically connected, for example, to the power supply voltage. In this state, a predetermined voltage is sequentially applied to the row selection signal lines 27. The electronic shutter operation can therefore be performed in the unit of a photoelectric conversion element row. The reset row-shifter 40 shown in FIG. 1A can be omitted.

If the reset row-shifter and third row-shifter are provided in addition to the readout row-shifter, these row-shifters may be disposed juxtaposed along one side of the semiconductor substrate or they may be disposed distributed in a plurality of areas of the semiconductor substrate.

The electronic shutter operation to be inhibited by the first, second or third still image mode controller is not limited only to the electronic shutter operation which otherwise being performed first after the still image indication signal was made in the moving image mode. The electronic shutter operation may be inhibited at a desired timing after the still image indication signal was made, depending upon the performance and application necessary for an electronic camera or the timing when the still image indication signal is made.

Although the MOS type solid-state image pickup device 100 constituting the electronic camera of each embodiment outputs analog image signals, it may output digital image signals.

Figure 12:
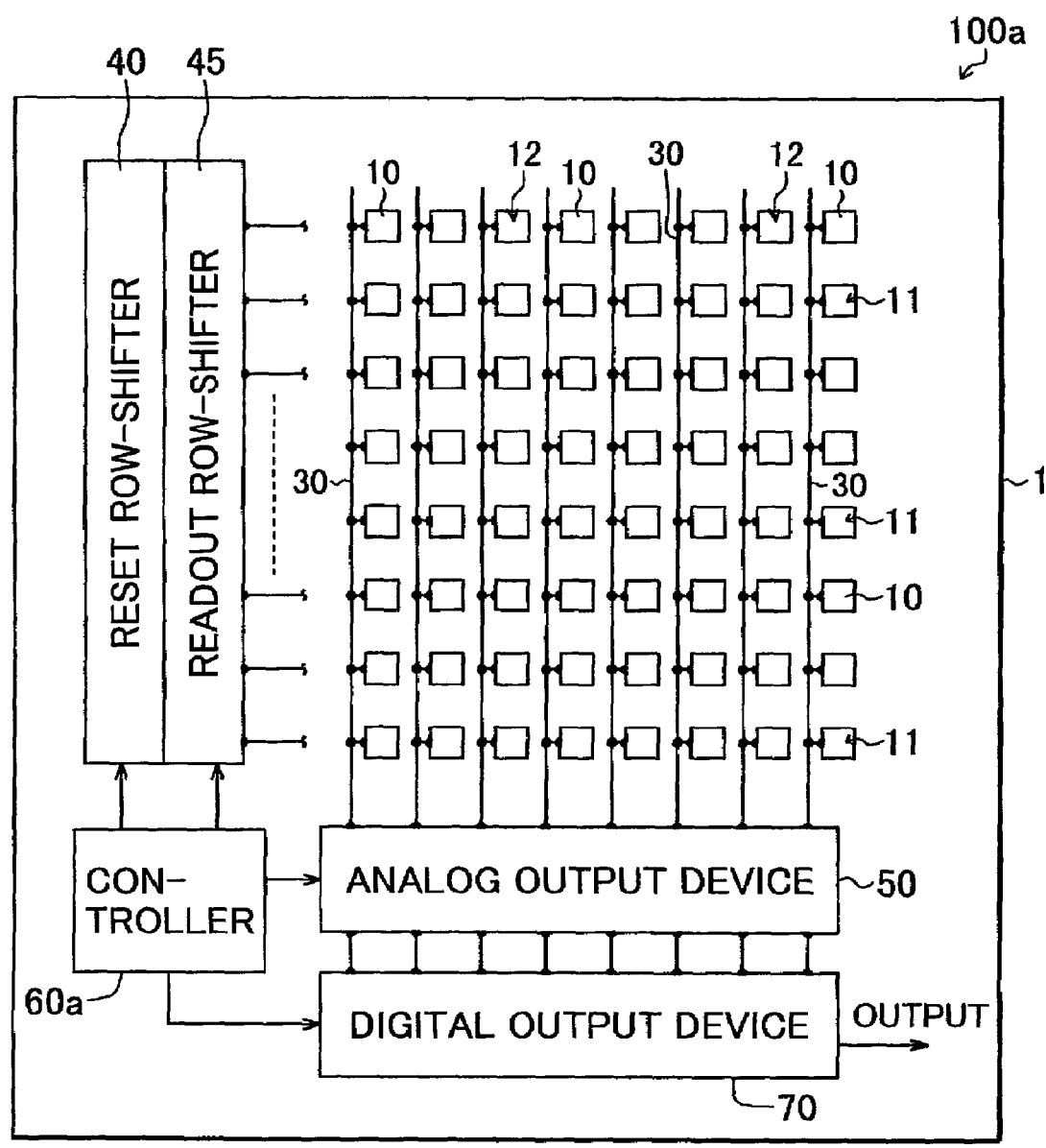
FIG. 12 is a schematic plan view showing an example of a MOS type solid-state image pickup device capable of outputting digital image signals.

FIG. 12 is a schematic plan view showing an example of a MOS type solid-state image pickup device capable of outputting digital image signals. A MOS type solid-state image pickup device 100*a* shown in FIG. 12 has a digital output device 70 added to the MOS type solid-state image pickup device 100 shown in FIG. 1A.

In FIG. 12, like constituent elements to those shown in FIG. 1A are represented by using identical reference symbols and the description thereof is omitted. Since the function of the controller is modified more or less because of the addition of the digital output device 70, the controller is represented by a new reference symbol "60*a*".

For example, the digital output device 70 includes an A/D converter disposed for each output signal line 30 and a buffer memory for temporarily storing digital signal output from each A/D converter and outputting the digital signals to the external.

Each A/D converter converts an analog image signal output from the analog output device 50 and representing the output signal generated on the corresponding output signal line 30 into a digital image signal and outputs it to the buffer memory. The buffer memory may be a semiconductor memory such as a dynamic random access memory (DRAM) or a static random access memory (SRAM).

The controller 60*a* controls the operations of the reset row-shifter 40, readout row-shifter 45 and analog output device 50 as well as the operation of the digital output device 70.

If the photoelectric conversion elements 10 are disposed in a pixel shift layout, one A/D converter may be provided per two output signal lines 30.

One A/D converter may be electrically connected to an output terminal of the analog output device 50.

The MOS type solid-state image pickup device may be a device for black and white image pickup or a device for color image pickup.

In a MOS type solid-state image pickup device either for black and white image pickup or for color image pickup, a light shielding film is used in order to avoid unnecessary photoelectric conversion in an area other than photoelectric conversion elements. In order to improve a light use efficiency of a photoelectric conversion element, a micro lens and/or an inner lens is provided for each photoelectric conversion element thereover. In a MOS type solid-state image pickup device for color image pickup, a color filter may be formed between a photoelectric conversion element and corresponding micro lens.

Figure 13:
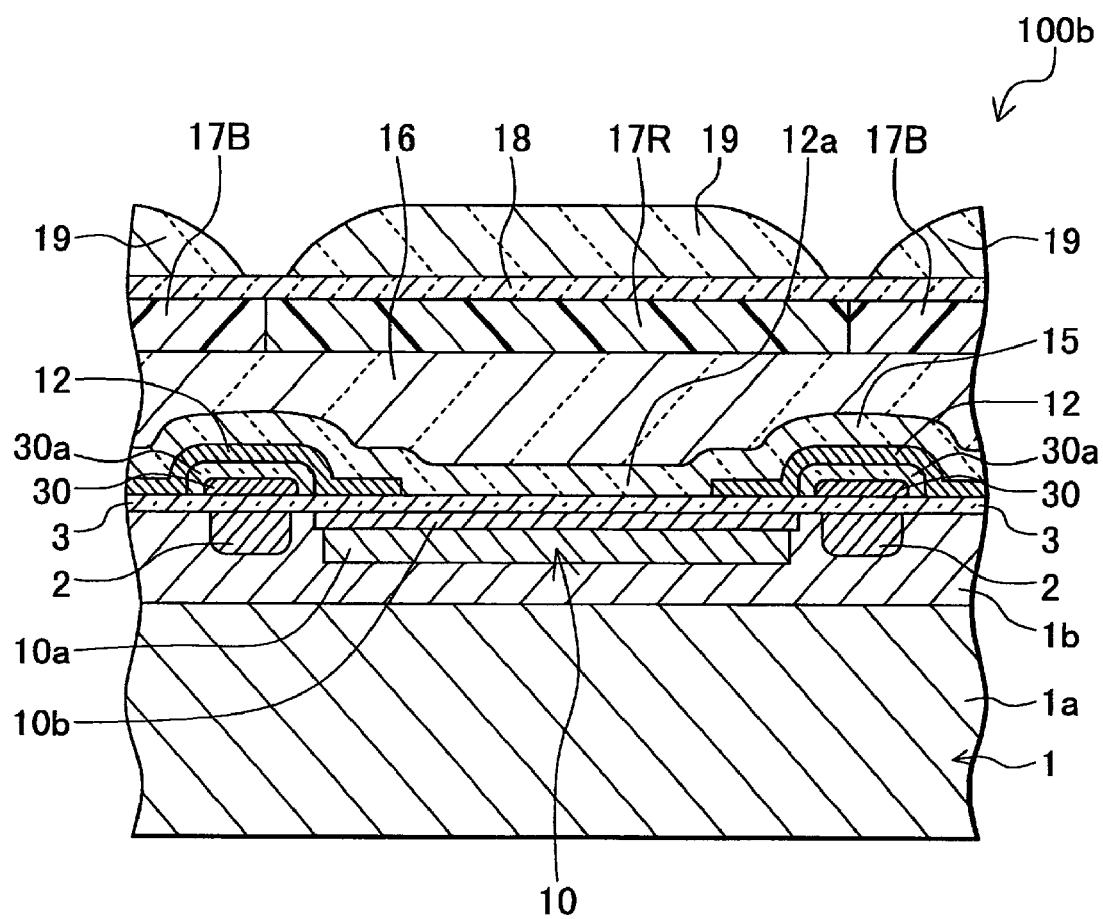
FIG. 13 is a schematic cross sectional view showing an example of a MOS type solid-state image pickup device for color image pickup.

FIG. 13 is a schematic cross sectional view showing an example of a MOS type solid-state image pickup device for color image pickup.

In a MOS type solid-state image pickup device 100*b* shown in FIG. 13, a light shielding film 12 is formed on a semiconductor substrate 1 formed with photoelectric conversion elements 10, switching circuits and their necessary wiring lines, row-shifters such as a readout row-shifter, output device such as an analog output device, and a controller.

The semiconductor substrate 1 is, for example, an n-type semiconductor substrate 1*a* and has a p-type impurity diffused region 1*b* formed on one surface of the n-type semiconductor substrate 1*a*.

Each photoelectric conversion element 10 is composed of, for example, a buried type photodiode having an n-type impurity diffused region 10*a* formed in a predetermined region of the p-type impurity diffused region 1*b* and a p$^+$-type impurity diffused region 10*b* formed on the n-type impurity diffused region 10*a*.

For example, a channel stop region 2 surrounding as viewed in plan each photoelectric conversion element 10 is formed in the p-type impurity diffused region 1*b*. This channel stop region 2 is made of, for example, a p$^+$-type impurity diffused region.

An electrically insulating layer 3 is formed covering the surfaces of the p$^+$-type impurity diffused region 10*b*, channel stop region 2 and p-type impurity diffused region 1*b*.

In another area of the semiconductor substrate 1, gate electrodes are formed on the electrically insulating layer 3, n-type regions are formed on both sides of each gate electrode to form transistors. A switching circuit is formed by electrically connecting a plurality of transistors. A CMOS circuit may be used by forming an n-channel transistor in the p-type impurity diffused region 1*b* or a p-channel transistor in the n-type impurity diffused region.

The switching circuits and their various wiring lines are formed on the electrically insulating layer 3. These wiring lines are insulated by electrically insulating films surrounding each of these lines. In the example shown in FIG. 13, output signal lines 30 and electrically insulating films 30*a* surrounding the output signal lines 30 are shown.

The light shielding film 12 has one opening 12*a* having a predetermined shape for each position corresponding to the photoelectric conversion elements 10 as viewed in plan. Each opening 12*a* is positioned as viewed in plan inside of the border of the n-type impurity diffused region 10*a* of the photoelectric conversion element 10.

For example, the light shielding film 12 is made of a metal thin film of aluminum, chrome, tungsten, titanium, molybdenum or the like, an alloy thin film of two or more types of these metals, a multi-layer metal thin film of two or more types of the above described metals or two or more types of combinations of the above-described metals and alloys, or the like.

A protective film 15 made of electrically insulating material is deposited on the light shielding film 12 and the electrically insulating film 3 exposed in the openings 12*a*. For example, the protective film 15 is made of a silicon nitride film, a silicon oxide film containing phosphorous or boron at a high concentration, or the like.

A first planarizing film 16 is formed on the protective film 15. The first planarizing film 16 is used also as a focus adjusting layer for micro lenses. If necessary, an inner lenses are formed in the first planarizing film 16.

For example, the first planarizing film 16 is formed by coating transparent resin such as photoresist to a desired thickness, for example, by spin coating.

A predetermined number of color filters are formed on the first planarizing film 16. A plurality type of color filters allowing color image pickup is formed in a predetermined pattern to constitute a color filter array. Color filter arrays of a three primary color type (red, green and blue) and of a so-called complementary type are known.

In the color filter array of both the three primary color type and complementary type, a color filter is disposed for each photoelectric conversion element thereover. In FIG. 13, three color filters 17R and 17B of two colors are shown.

For example, the color filter array is formed by forming resin layers (color resin layers) containing pigment or dye having desired colors in predetermined areas, for example, by photolithography.

A second planarizing film 18 is formed on the color filter array. For example, the second planarizing film 18 is formed by coating transparent resin such as photoresist to a desired thickness, for example, by spin coating.

A predetermined number of micro lenses 19 are formed on the second planarizing film 18. One micro lens 19 is disposed for each photoelectric conversion element 10 thereover to constitute a micro lens array.

For example, the micro lens 19 is formed by dividing a transparent resin (e.g., photoresist) layer having a refractive index of about 1.3 to 2.0 into division areas by photolithography or the like and melting the transparent resin layer in each division area by heat treatment to round the corners through surface tension and thereafter cool the resin layer.

The operation of each electronic camera of the embodiment has been described taking as an example the case wherein while the image signal read operations and electronic shutter operations corresponding to the progressive scanning are performed by the moving image mode controller, the mode is switched to a control by the first, second or third still image mode controller.

The moving image mode controller may perform the image signal read operations and electronic shutter operations corresponding to scanning other than the progressive scanning, such as interlace scanning and thinning-out scanning.

For example, in performing one image signal read operation corresponding to interlace scanning by the MOS type solid-state image pickup device 100 shown in FIG. 1, an operation of generating output signals on the output signal lines 30 and a reset operation are sequentially performed in the unit of every second photoelectric conversion element row of the first to eighth photoelectric conversion element rows 11.

In performing an image signal read operation corresponding to thinning-out scanning by the MOS type solid-state image pickup device 100 shown in FIG. 1, an operation of generating output signals on the output signal lines 30 and a reset operation are sequentially performed in the unit of every second or more photoelectric conversion element row of the first to eighth photoelectric conversion element rows 11.

While the moving image mode controller performs the image signal read operations and electronic shutter operations corresponding to scanning other than the progressive scanning, such as interlace scanning or thinning-out scanning, the mode can be switched to a control under the first, second or third still image mode controller.

In such a case, the time taken for one electronic shutter operation under the control of the moving image mode controller to complete becomes in some cases different from the time taken for one image signal read operation under the control of the first, second or third still image mode controller to complete.

Specifically, if the image signal read operation under the control of the first, second or third still image mode controller is an image signal read operation corresponding to progressive scanning, the time taken for one image signal read operation to complete is different from the time taken for one electronic shutter operation associated with the image signal read operation corresponding to interlace scanning or thinning-out scanning. Therefore, the exposure time of each photoelectric conversion element changes in the unit of a photoelectric conversion element row.

In such a case, it is desired that after the same exposure time is set to each photoelectric conversion element, the image signal read operation under the control of the first, second or third still image mode controller is performed.

In order to realize this, for example, one image signal read operation corresponding to progressive scanning and one electronic shutter operation following the image signal operation are performed once prior to setting the still image signal read period. These operations may be controlled either by the moving image mode controller or by the first, second or third still image controller. In this case, image data may not be generated through the image signal read operation. The electronic shutter operation is an electronic shutter operation corresponding to progressive scanning.

The number of electronic shutter operations to be inhibited by the second still image mode controller is not limited only to one. Similarly, the electronic shutter operation to be inhibited by the second still image mode controller is not limited only to the electronic shutter operation which otherwise starts during the vertical blanking period first set after the still image indication signal was made. At least one electronic shutter operation may be inhibited at a desired timing after the still image signal was made, depending upon the performance and application necessary for an electronic camera or the timing when the still image indication signal is made.

If the third still image mode controller is used as in the electronic camera 300 shown in FIG. 6, the second still image mode controller may be omitted.

If an electronic camera has the third still image mode controller and auto iris such as the electronic camera 310 shown in FIG. 8, the third still image mode controller may not perform the AI operation.

The flashing device may be built in an electronic camera or externally mounted on the electronic camera. If the flashing device is to be externally mounted, the electronic camera has a flashing device mount for mounting the flashing device. This flashing device mount may be used as the still image mode designating device. Namely, when the flashing device is mounted, the flashing device mount controls the second switching device 165 (refer to FIG. 2) so that the second still image mode controller 135 (refer to FIG. 2) is specified. The present invention has been described in connection with the preferred embodiments. The invention is not limited only to the above embodiments. It is apparent that various modifications, improvements, combinations, and the like can be made by those skilled in the art.

As described so far, the present invention provides an electronic camera utilizing a MOS type solid-state image pickup device which camera can generate backlight corrected still image data of an object. Application fields of an electronic camera utilizing a MOS type solid-state image pickup device can be expanded.

What we claim are:

1. An electronic camera that does not use a mechanical shutter, comprising:
    a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals;

an image signal processor for generating moving image data or still image data based on said image signals output from said MOS type solid-state image pickup device;

a still image indication signal generator for generating a still image indication signal for indicating image pickup of a still image;

a flashing device for emitting a flash in response to a reception of a predetermined signal;

a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements; and a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type solid-state image pickup device perform an image signal read operation of sequentially supplying said row selection signal from the readout row-shifter to each row selection signal line for sequentially generating said output signals on each output signal line;

wherein said correcting still image mode controller does not intercept the electronic shutter operation or the image signal read operation under execution when said still image indication signal is made, if there is the electronic shutter operation under execution when said still image indication signal is made, said correcting still image mode controller makes said MOS type solid-state image pickup device perform the image signal read operation following said electronic shutter operation and after a lapse in exposure time, and thereafter said flashing device operation signal is made.

2. An electronic camera according to claim 1, wherein the image signal read operation by said moving image mode controller and the image signal read operation by said correcting still image mode controller include (i) operation of sequentially supplying said row selection signal from the readout row-shifter to a plurality of predetermined row selection signal lines for sequentially generating said output signals on each output signal line in the unit of a photoelectric conversion element row and (ii) operation of sequentially draining said charges accumulated in each photoelectric conversion element from which said output signal was generated, in the unit of a photoelectric conversion element row.

3. An electronic camera according to claim 2, wherein said output device includes an analog output device for generating and outputting analog image signals representative of said output signals and a digital output device for receiving said analog image signals, converting said analog image signals into digital image signals, and outputting said digital image signals.

4. An electronic camera according to claim 1, further comprising: an auto iris for adjusting an amount of light incident upon said MOS type solid-state image pickup device, wherein said correcting still image mode controller in operation further performs an exposure amount adjustment operation of adjusting said auto iris to reduce a difference between exposure amounts to be caused by a difference between an exposure time under a control of said correcting still image mode controller and an exposure time under a control of said moving image mode controller.

5. An electronic camera that does not use a mechanical shutter, comprising:
a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals;

an image signal processor for generating moving image data or still image data based on said image signals output from said MOS type solid-state image pickup device;

a still image indication signal generator for generating a still image indication signal for indicating image pickup of a still image;

a flashing device for emitting a flash in response to a reception of a predetermined signal;

a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements;

a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type solid-state image pickup device perform an image signal read operation of sequentially supplying said row selection signal from the readout row-shifter to each row selection signal line for sequentially generating said output signals on each output signal line;

a non-correcting still image mode controller being connected to said MOS type solid-state image pickup device for controlling operation of said MOS type solid-state image pickup device in place of said moving image mode controller when said still image indication signal is made, wherein without making said flashing device operation signal, said non-correcting still image mode controller makes said MOS type solid-state image pickup device perform an image signal read operation of sequentially supplying said row selection signal from the readout row-shifter to each row selection signal line for sequentially generating said output signals on each output signal line; and still image mode designating device for specifying beforehand a still image mode controller to be operated when said still image indication signal is made;

wherein said correcting still image mode controller and said non-correcting still image mode controller do not intercept the electronic shutter operation or the image signal read operation under execution when said still image indication signal is made if there is the electronic shutter operation under execution when said still image indication signal is made, said correcting still image mode controller and said non-correcting still image mode controller make said MOS type solid-state image pickup device perform the image signal read operation following said electronic shutter operation and after a lapse in exposure time, and thereafter said flashing device operation signal is made.

6. An electronic camera according to claim 5, wherein the image signal read operation by said moving image mode controller, the image signal read operation by said correcting still image mode controller and the image signal read operation by said non-correcting still image mode controller include (i) operation of sequentially supplying said row selection signal from the readout row-shifter to a plurality of predetermined row selection signal lines for sequentially generating said output signals on each output signal line in the unit of a photoelectric conversion element row and (ii) operation of sequentially draining said charges accumulated in each photoelectric conversion element from which said output signal was generated, in the unit of a photoelectric conversion element row.

7. An electronic camera according to claim 5, further comprising: an auto iris for adjusting an amount of light incident upon said MOS type solid-state image pickup device, wherein said correcting still image mode controller and said non-correcting still image mode controller in operation further perform an exposure amount adjustment operation of adjusting said auto iris to reduce a difference between exposure amounts to be caused by a difference between an exposure time under a control of said correcting still image mode controller or said non-correcting still image mode controller and an exposure time under a control of said moving image mode controller.

8. An electronic camera according to claim 5, wherein the output device includes an analog output device for generating and outputting analog image signals representative of said output signals and a digital output device for receiving said analog image signals, converting said analog image signals into digital image signals, and outputting said digital image signals.

9. An electronic camera comprising:
a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals;

an image signal processor for generating moving image data or still image data based on said image signals output from said MOS type solid-state image pickup device;

a still image indication signal generator for generating a still image indication signal for indicating image pickup of a still image;

a flashing device for emitting a flash in response to a reception of a predetermined signal, or a flashing device mount for mounting said flashing device;

a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements;

a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type solid-state image pickup device perform an image signal read operation of sequentially supplying said row selection signal from the readout row-shifter to each row selection signal line for sequentially generating said output signals on each output signal line;

a third still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set longer than a time duration including an issuance time of said flashing device operation signal and necessary for performing two image signal read operations before and after one electronic shutter operation, and after a lapse of said exposure time, said third still image mode controller makes said MOS type solid-state image pickup device perform an image signal read operation of sequentially supplying said row selection signal from the readout row-shifter to each row selection signal line for sequentially generating said output signals on each output signal line; and still image mode designating device for specifying beforehand a still image mode controller to be operated when said still image indication signal is made.

10. An electronic camera according to claim 9, wherein the image signal read operation by said moving image mode controller, the image signal read operation by said correcting still image mode controller and the image signal read operation by said third still image mode controller include (i) operation of sequentially supplying the row selection signal to a plurality of predetermined row selection signal lines from the readout row-shifter for sequentially generating the output signals on each output signal line in the unit of a photoelectric conversion element row and (ii) operation of sequentially draining said charges accumulated in each photoelectric conversion element from which said output signal was generated, in the unit of a photoelectric conversion element row.

11. An electronic camera according to claim 9, wherein said correcting still image mode controller and said third still image mode controller do not intercept the electronic shutter operation or the image signal read operation under execution when said still image indication signal is made, if there is the electronic shutter operation under execution when said still image indication signal is made, said correcting still image mode controller and said third still image mode controller make said MOS type solid-state image pickup device perform the image signal read operation following said electronic shutter operation and after a lapse in exposure time, and thereafter said flashing device operation signal is made.

12. An electronic camera according to claim 11, wherein said correcting still image mode controller makes said MOS type solid-state image pickup device perform the image signal read operation following said electronic shutter operation and the lapse of said exposure time.

13. An electronic camera according to claim 9, further comprising:

a non-correcting still image mode controller being connected to said MOS type solid-state image pickup device for controlling operation of said MOS type solid-state image pickup device in place of said moving image mode controller when said still image indication signal is made, wherein without making said flashing device operation signal, said non-correcting still image mode controller makes said MOS type solid-state image pickup device perform an image signal read operation of sequentially supplying said row selection signal from the readout row-shifter to each row selection signal line for sequentially generating said output signals on each output signal line; and still image mode designating device for specifying beforehand a still image mode controller to be operated when said still image indication signal is made.

14. An electronic camera according to claim 13, wherein the image signal read operation by said moving image mode controller, the image signal read operation by said correcting still image mode controller, the image signal read operation by said third still image mode controller and the image signal read operation by said non-correcting still image mode controller include (i) operation of sequentially supplying the row selection signal from the readout row-shifter to a plurality of predetermined row selection signal lines for sequentially generating said output signals on each output signal line in the unit of a photoelectric conversion element row and (ii) operation of sequentially draining said charges accumulated in each photoelectric conversion element from which said output signal was generated, in the unit of a photoelectric conversion element row.

15. An electronic camera according to claim 13, wherein said correcting still image mode controller, said third still image mode controller and said non-correcting still image mode controller do not intercept the electronic shutter operation or the image signal read operation under execution when said still image indication signal is made, if there is the electronic shutter operation under execution when said still image indication signal is made, said correcting still image mode controller, said third still image mode controller and said non-correcting still image mode controller make said MOS type solid-state image pickup device perform the image signal read operation following said electronic shutter operation and after a lapse in exposure time, and thereafter said flashing device operation signal is made.

16. An electronic camera according to claim 15, wherein said correcting still image mode controller makes said MOS type solid-state image pickup device perform the signal read operation following said electronic shutter operation and the lapse of said exposure time.

17. An electronic camera according to claim 10, further comprising:
an auto iris for adjusting an amount of light incident upon said MOS type solid-state image pickup device,
wherein said correcting still image mode controller, said third still image mode controller and said non-correcting still image mode controller in operation further perform an exposure amount adjustment operation of adjusting said auto iris to reduce a difference between exposure amounts to be caused by a difference between an exposure time under a control of said correcting still image mode controller, said third still image mode controller or said non-correcting still image mode controller and an exposure time under a control of said moving image mode controller.

18. An electronic camera according to claim 13, wherein said output device includes an analog output device for generating and outputting analog image signals representative of said output and a digital output device for receiving said analog image signals, converting said analog image signals into digital image signals, and outputting said digital image signals.

19. An electronic camera according to claim 9, further comprising:
an auto iris for adjusting an amount of light incident upon said MOS type solid-state image pickup device,
wherein said correcting still image mode controller and said third still image mode controller in operation further perform an exposure amount adjustment operation of adjusting said auto iris to reduce a difference between exposure amounts to be caused by a difference between an exposure time under a control of said correcting still image mode controller or said third still image mode controller and an exposure time under a control of said moving image mode controller.

20. An electronic camera according to claim 9, wherein said output device includes an analog output device for generating and outputting analog image signals representative of said output signals and a digital output device for receiving said analog image signals, converting said analog image signals into a digital image signals, and outputting said digital image signals.

21. An electronic camera that does not use a mechanical shutter, comprising:
a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals;
an image signal processor for generating moving image data or still image data based on said image signals output from said MOS type solid-state image pickup device;
a still image indication signal generator for generating a still image indication signal for indicating image pickup of a still image;
a flashing device for emitting a flash in response to a reception of a predetermined signal;
a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements; and a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type solid-state image pickup device perform an image signal read operation of sequentially supplying said row selection signal from the readout row-shifter to each row selection signal line for sequentially generating said output signals on each output signal line, wherein the image signal read operation by said moving image mode controller and the image signal read operation by said correcting still image mode controller include (i) operation of sequentially supplying said row selection signal from the readout row-shifter to a plurality of predetermined row selection signal lines for sequentially generating said output signals on each output signal line in the unit of a photoelectric conversion element row and (ii) operation of sequentially draining said charges accumulated in each photoelectric conversion element from which said output signal was generated, in the unit of a photoelectric conversion element row, wherein said correcting still image mode controller does not intercept the electronic shutter operation or the image signal read operation under execution when said still image indication signal is made, if there is the electronic shutter operation under execution when said still image indication signal is made, said correcting still image mode controller makes said MOS type solid-state image pickup device perform the image signal read operation following said electronic shutter operation and after a lapse in exposure time, and thereafter said flashing device operation signal is made, wherein said correcting still image mode controller makes said MOS type solid-state image pickup device perform the image signal read operation following said electronic shutter operation and the lapse of said exposure time.

22. An electronic camera that does not use a mechanical shutter, comprising:

a MOS type solid-state image pickup device comprising (i) a semiconductor substrate, (ii) a number of photoelectric conversion elements formed in one surface of said semiconductor substrate in a matrix shape along a plurality of rows and columns, (iii) a switching circuit provided for each photoelectric conversion element and electrically connected to an corresponding photoelectric conversion element, each switching circuit controlling generation of an output signal representative of charge accumulated in said corresponding photoelectric conversion element and drainage of said charge, (iv) a row selection signal line disposed for each photoelectric conversion element row and electrically connected to corresponding switching circuits, each row selection signal line being supplied with a row selection signal for controlling generation of said output signal, (v) a plurality of output signal lines each of which is corresponded to at least one pixel column and on each of which said output signal is generated, (vi) a reset signal line disposed for each photoelectric conversion element row and electrically connected to corresponding switching circuits, each reset signal line being supplied with a reset signal for controlling drainage of said charges, (vii) a readout row-shifter for sequentially supplying said row selection signal to each row selection signal line, (viii) a reset row-shifter for sequentially supplying said reset signal to each reset signal line, and (ix) an output device electrically connected to each output signal line for sequentially generating and outputting image signals representative of said output signals;

an image signal processor for generating moving image data or still image data based on said image signals output from said MOS type solid-state image pickup device;

a still image indication signal generator for generating a still image indication signal for indicating image pickup of a still image;

a flashing device for emitting a flash in response to a reception of a predetermined signal;

a moving image mode controller being connected to said MOS type solid-state image pickup device for continually controlling operation of said MOS type solid-state image pickup device, said moving image mode controller makes said MOS type solid-state image pickup device repeat (a) an image signal read operation of sequentially supplying said row selection signal from the readout row-shifter to a plurality of predetermined row selection signal lines for sequentially generating said output signals on each output signal line and (b) an electronic shutter operation of sequentially supplying said reset signal from the reset row-shifter to said reset signal lines corresponding to at least said rows to be subjected to said image signal read operation for sequentially draining said charges accumulated in the photoelectric conversion elements;

a correcting still image mode controller being connected to said MOS type solid-state image pickup device for controlling operation of said MOS type solid-state image pickup device in place of said moving image mode controller when said still image indication signal is made, wherein a flashing device operation signal for operating said flashing device is made in the state that said readout row-shifter and said reset row-shifter are not operated, an exposure time of each photoelectric conversion element is set equal to or shorter than a time duration including an issuance time of said flashing device operation signal and necessary for performing two image signal read operations before and after one electronic shutter operation, and after a lapse of said exposure time, said correcting still image mode controller makes said MOS type solid-state image pickup device perform an image signal read operation of sequentially supplying said row selection signal from the readout row-shifter to each row selection signal line for sequentially generating said output signals on each output signal line;

a non-correcting still image mode controller being connected to said MOS type solid-state image pickup device for controlling operation of said MOS type solid-state image pickup device in place of said moving image mode controller when said still image indication signal is made, wherein without making said flashing device operation signal, said non-correcting still image mode controller makes said MOS type solid-state image pickup device perform an image signal read operation of sequentially supplying said row selection signal from the readout row-shifter to each row selection signal line for sequentially generating said output signals on each output signal line; and still image mode designating device for specifying beforehand a still image mode controller to be operated when said still image indication signal is made;

wherein said correcting still image mode controller and said non-correcting still image mode controller do not intercept the electronic shutter operation or the image signal read operation under execution when said still image indication signal is made, if there is the electronic shutter operation under execution when said still image indication signal is made, said correcting still image mode controller and said non-correcting still image mode controller make said MOS type solid-state image pickup device perform the image signal read operation following said electronic shutter operation and after a lapse in exposure time, and thereafter said flashing device operation signal is made, wherein said correcting still image mode controller makes said MOS type solid-state image pickup device perform the image signal read operation following said electronic shutter operation and the lapse of said exposure time.

* * * * *